(12) United States Patent
Shih

(10) Patent No.: US 11,315,904 B2
(45) Date of Patent: Apr. 26, 2022

(54) SEMICONDUCTOR ASSEMBLY AND METHOD OF MANUFACTURING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/875,660

(22) Filed: May 15, 2020

(65) Prior Publication Data

US 2021/0358889 A1 Nov. 18, 2021

(51) Int. Cl.
| | |
|---|---|
| H01L 25/065 | (2006.01) |
| H01L 23/00 | (2006.01) |
| H01L 23/48 | (2006.01) |
| H01L 21/768 | (2006.01) |
| H01L 25/00 | (2006.01) |

(52) U.S. Cl.
CPC .... *H01L 25/0657* (2013.01); *H01L 21/76852* (2013.01); *H01L 21/76898* (2013.01); *H01L 23/481* (2013.01); *H01L 24/32* (2013.01); *H01L 24/83* (2013.01); *H01L 25/50* (2013.01); *H01L 2224/32145* (2013.01); *H01L 2224/83896* (2013.01); *H01L 2225/06544* (2013.01); *H01L 2924/1434* (2013.01)

(58) Field of Classification Search
CPC ..... H01L 25/0657; H01L 24/83; H01L 25/50; H01L 2924/1434; H01L 21/76832; H01L 21/76898; H01L 21/481
See application file for complete search history.

(56) References Cited

U.S. PATENT DOCUMENTS

2018/0068984 A1* 3/2018 Beyne ............... H01L 21/76877
2020/0006266 A1* 1/2020 Chen ...................... H01L 25/04

* cited by examiner

*Primary Examiner* — Jasmine J Clark
(74) *Attorney, Agent, or Firm* — Muncy, Geissler, Olds & Lowe, PC

(57) ABSTRACT

A semiconductor assembly comprises a first device, a second device, a passivation layer and an interconnect structure. The first device comprises a first top metal layer. The second device comprises a second bottom metal layer. The passivation layer is disposed on the second device. The interconnect structure electrically couples the first device to the second device, wherein the interconnect structure comprises a head member, a first leg and a second leg. The head member is disposed on the passivation layer. The first leg penetrates through the passivation layer and the second device, wherein the first leg connects the head member to the first top metal layer. The second leg penetrates through the passivation layer and extends into the second device to connect the head member to the second bottom metal layer. The first leg and the second leg comprise a top portion, an intermediate portion and a bottom portion.

20 Claims, 28 Drawing Sheets

SEMICONDUCTOR ASSEMBLY AND METHOD OF MANUFACTURING THE SAME

TECHNICAL FIELD

The present disclosure relates generally to a semiconductor assembly and, more particularly, to a semiconductor assembly with three-dimensional integrated circuits (3D ICs) and a method of manufacturing the same.

DISCUSSION OF THE BACKGROUND

As integrated circuit (IC) technologies continue to advance, ongoing efforts seek to increase performance or reduce costs. One approach explored to realize such benefits is implementation of stacked three-dimensional integrated circuits (3D ICs). Such 3D IC technology is driven by strong demand for high-speed, high-density, small and multifunctional electronic devices. Some areas where 3D ICs are a suitable consideration include stacking of two or more chips fabricated using different processes or stacking of chips that are fabricated using the same process to reduce the footprint of the IC apparatus.

Through-silicon via (TSV) interconnection is an effective approach for 3D integration due to its shortest interconnection distance and fastest speed. Typically, TSVs are formed by etching vias through the chip and filling the vias with metal after chip circuits and wiring are nearly complete. TSV etching requires etching vias completely through a stack of back end of line (BEOL) layers to the silicon chip.

The 3D ICs provide advantages of integration density, greater speed and greater bandwidth, because of the decreased length of interconnects between the stacked devices. However, there are many challenges related to 3D ICs.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor assembly. The semiconductor assembly comprises a first device, a second device, a passivation layer and an interconnect structure. The first device comprises a first top metal layer. The second device is bonded to the first device and comprises a second bottom metal layer. The passivation layer is disposed on the second device. The interconnect structure electrically couples the first device to the second device, wherein the interconnect structure comprises a head member, a first leg and a second leg. The head member is disposed on the passivation layer. The first leg penetrates through the passivation layer and the second device, wherein the first leg connects the head member to the first top metal layer. The second leg penetrates through the passivation layer and extends into the second device to connect the head member to the second bottom metal layer. The first leg and the second leg comprise a top portion and a bottom portion. The top portion is disposed in the passivation layer and has a first critical dimension. The bottom portion is connected to the top portion and has a second critical dimension, wherein the second critical dimension is greater than the first critical dimension.

In some embodiments, the first device and the second device are memory devices.

In some embodiments, the first leg electrically connects the first top metal layer of the first device to the head member and the second leg electrically connects the second bottom metal layer of the second device to the head member.

In some embodiments, the semiconductor assembly further comprises a bonding layer interposed between the first device and the second device.

In some embodiments, the first device and the second device are arranged in a front-to-front configuration.

In some embodiments, the head member is surrounded by a protection layer.

In some embodiments, the head member is above the first leg and the second leg.

In some embodiments, the semiconductor assembly further comprises a liner layer, wherein the first leg and the second leg are surrounded by the liner layer.

Another aspect of the present disclosure provides a semiconductor assembly. The semiconductor assembly comprises a first device, a second device, a passivation layer and an interconnect structure. The first device comprises a first top metal layer. The second device is bonded to the first device and comprises a second bottom metal layer. The passivation layer is disposed on the second device. The interconnect structure electrically couples the first device to the second device, wherein the interconnect structure comprises a head member, a first leg and a second leg. The head member is disposed on the passivation layer. The first leg penetrates through the passivation layer and the second device, wherein the first leg connects the head member to the first top metal layer. The second leg penetrates through the passivation layer and extends into the second device to connect the head member to the second bottom metal layer. The first leg and the second leg comprise a top portion, an intermediate portion and a bottom portion. The top portion penetrates through the passivation layer and has a first critical dimension that gradually decreases at positions of increasing distance from the head member. The intermediate portion extends from the top portion and penetrates through a second substrate of the second device, wherein the intermediate portion has a second critical dimension that gradually increases at positions of increasing distance from the head member. The bottom portion extends from the intermediate portion.

In some embodiments, the bottom portion has a substantially uniform critical dimension.

In some embodiments, the top portion and the intermediate portion have identical maximum critical dimension.

In some embodiments, the semiconductor assembly further comprises a liner layer, wherein the first leg and the second leg are surrounded by the liner layer.

In some embodiments, the head member is surrounded by a protection layer.

In some embodiments, the semiconductor assembly further comprises a bonding layer interposed between the first device and the second device.

Another aspect of the present disclosure provides a method for fabricating a semiconductor assembly. The method comprises providing a first device and a second device, wherein the first device comprises a first top metal layer and the second device comprises a second bottom metal layer disposed on a second substrate; bonding the second device to the first device via a bonding layer; forming a passivation layer on the second device; forming a first trench penetrating through the passivation layer, the second device and the bonding layer to expose the first top metal layer; forming a second trench penetrating through the passivation layer and a portion of the second device to expose the second bottom metal layer; forming a liner layer within the first trench and the second trench; and depositing a first conductive material to fill the first trench and the second trench, wherein surfaces of the passivation layer exposed by the first trench and the second trench are discontinuous with surfaces of the second substrate exposed by the first trench and the second trench.

In some embodiments, the forming of the first trench and the second trench comprise: forming a plurality of first openings penetrating through the passivation layer; forming a plurality of second openings penetrating through the second substrate, wherein the second openings connected to the first openings; forming a third opening connected to one of the second openings to expose the first top metal layer; and forming a fourth opening connected to the other second opening to expose the second bottom metal layer.

In some embodiments, the first openings have a first width that gradually decreases at positions of decreasing distance from the first device.

In some embodiments, the second openings have a second width that gradually increases at positions of decreasing distance from the first device.

In some embodiments, the method further comprises: performing a polishing process to remove the first conductive material above a top surface of the passivation layer.

In some embodiments, the method further comprises: forming a protection layer on the passivation layer; forming a contact hole that exposes a portion of the passivation layer and the first conductive material in the first trench and in the second trench and; and depositing a second conductive material in the contact hole.

In the present disclosure, the waist portions prevent the first trench and the second trench from forming a funnel-shaped profile so that the liner layer on a sidewall surface within the trench will not be overly consumed in a subsequent liner etching process. A liner layer can be robustly formed in the first trench and the second trench without a crack or hole appearing in the liner layer. As a result, the first leg and the second leg can be completely isolated from the second device. The copper-containing material in the first conductive material will not diffuse through the liner to the silicon-containing second device. In addition, current leakage or shorting problems can be prevented by isolation provided by the liner.

The foregoing has outlined rather broadly the features and technical advantages of the present disclosure in order that the detailed description of the disclosure that follows may be better understood. Additional features and technical advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
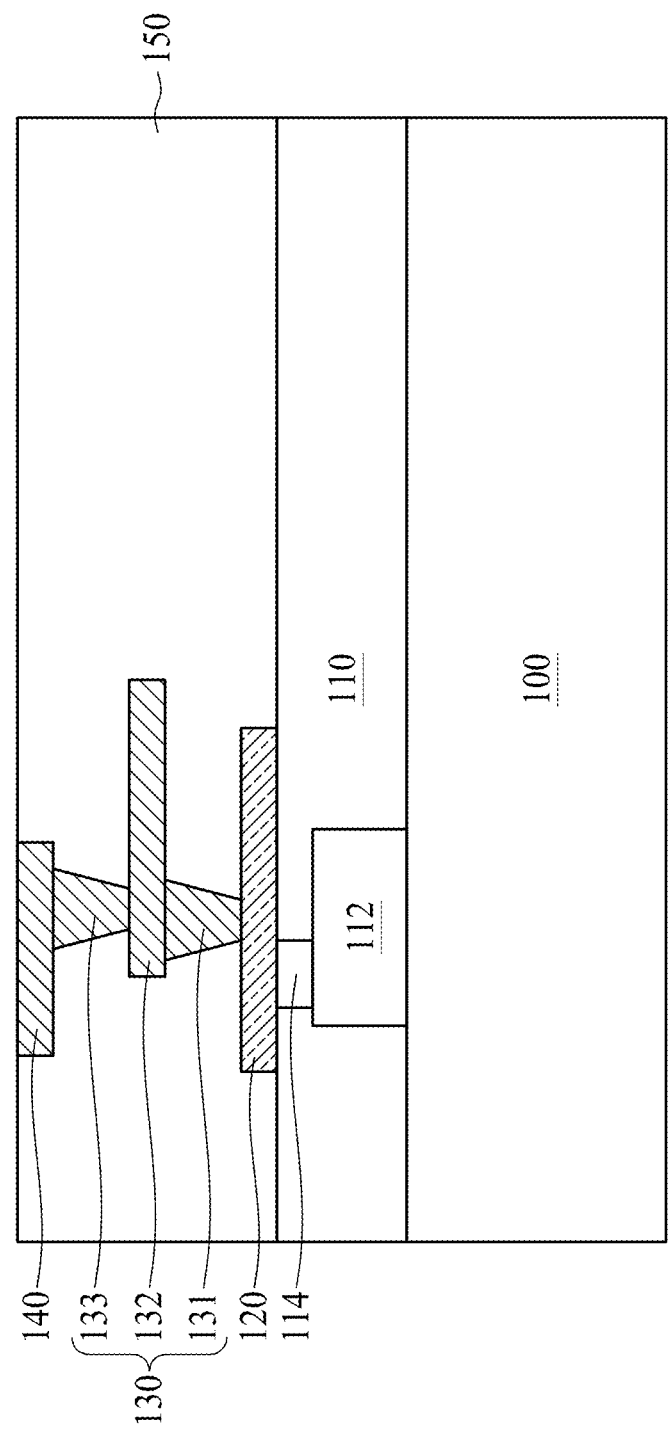
FIG. 1 is a schematic cross-sectional view of a first device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of a first device 10. In some embodiments, the first device 10 may be a memory device. The process for fabricating the first device 10 comprises providing a first substrate 100. In some embodiments, the first substrate 100 may include silicon, silicon germanium (SiGe), gallium arsenide (GaAs), or other suitable semiconductor materials. A first main component 112 is formed on the first substrate 100. In some embodiments, the first main component 112 may include transistors, capacitors, resistors, diodes and the like formed in a front-end-of-line (FEOL) process. In some embodiments, the first main component 112 can also include doped regions, isolation structures, conductive materials or dielectric materials. Next, a first dielectric layer 110 is formed on the first substrate 100 to cover the first main component 112. In some embodiments, the first main component 112 is completely embedded in the first dielectric layer 110. A first conductive plug 114 is formed on the first main component 112 to provide an electrical connection between the first main component 112 and subsequent components. Specifically, the fabrication of the first conductive plug 114 involves sequentially forming a contact hole (not shown) in the first dielectric layer 110 over the first main component 112, wherein the contact hole exposes a portion of the first main component 112, and filling the contact hole with conductive materials. Subsequently, a first bottom metal layer (BML) 120 is formed on the first dielectric layer 110. In some embodiments, the first BML 120 may include copper or other suitable conductive materials. The first BML 120 is electrically connected to the first main component 112 via the first conductive plug 114. Subsequently, a first multilayer interconnect (MLI) 130 is formed on the first BML 120. The first MLI 130 may include vertical interconnects 131 and 133 and/or horizontal interconnects 132. The vertical interconnects and horizontal interconnects are alternately stacked with one another. In some embodiments, the first MLI 130 can have more layers than those shown in FIG. 1. A first top metal layer (TML) 140 is then formed on the first MLI 130 and is electrically connected to the first MLI 130. In some embodiments, the first TML 140 may include aluminum or other suitable conductive materials. The first BML 120, the first MLI 130 and the first TML 140 are embedded in a first inter-metal dielectric (MID) 150. In some embodiments, the first ID 150 can include silicon oxide, silicon nitride, oxynitride, borosilicate glass (BSG), low-k material, another suitable material or a combination thereof. In some embodiments, the method of forming the first IMD 150 can include a chemical vapor deposition (CVD) process, a spin-coating process, or another suitable process that can form dielectric materials.

Figure 2A:
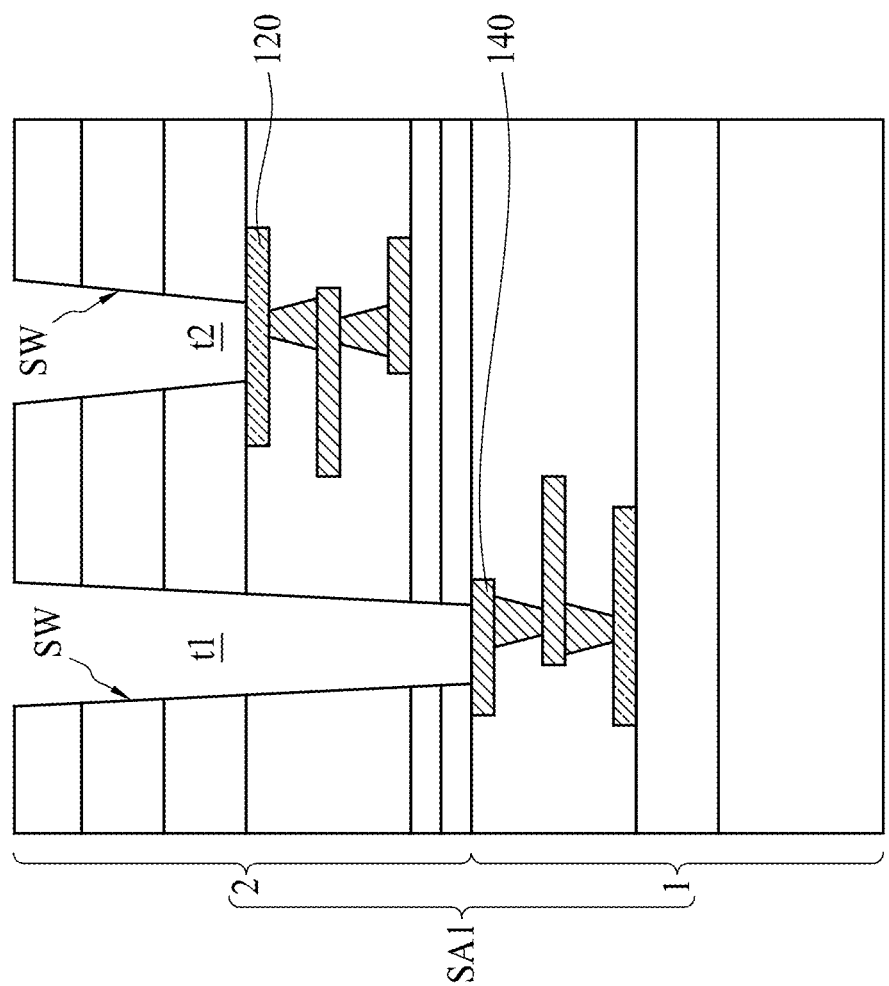
FIG. 2A is a schematic cross-sectional view of a semiconductor assembly, in accordance with a comparative embodiment.
Figure 2B:
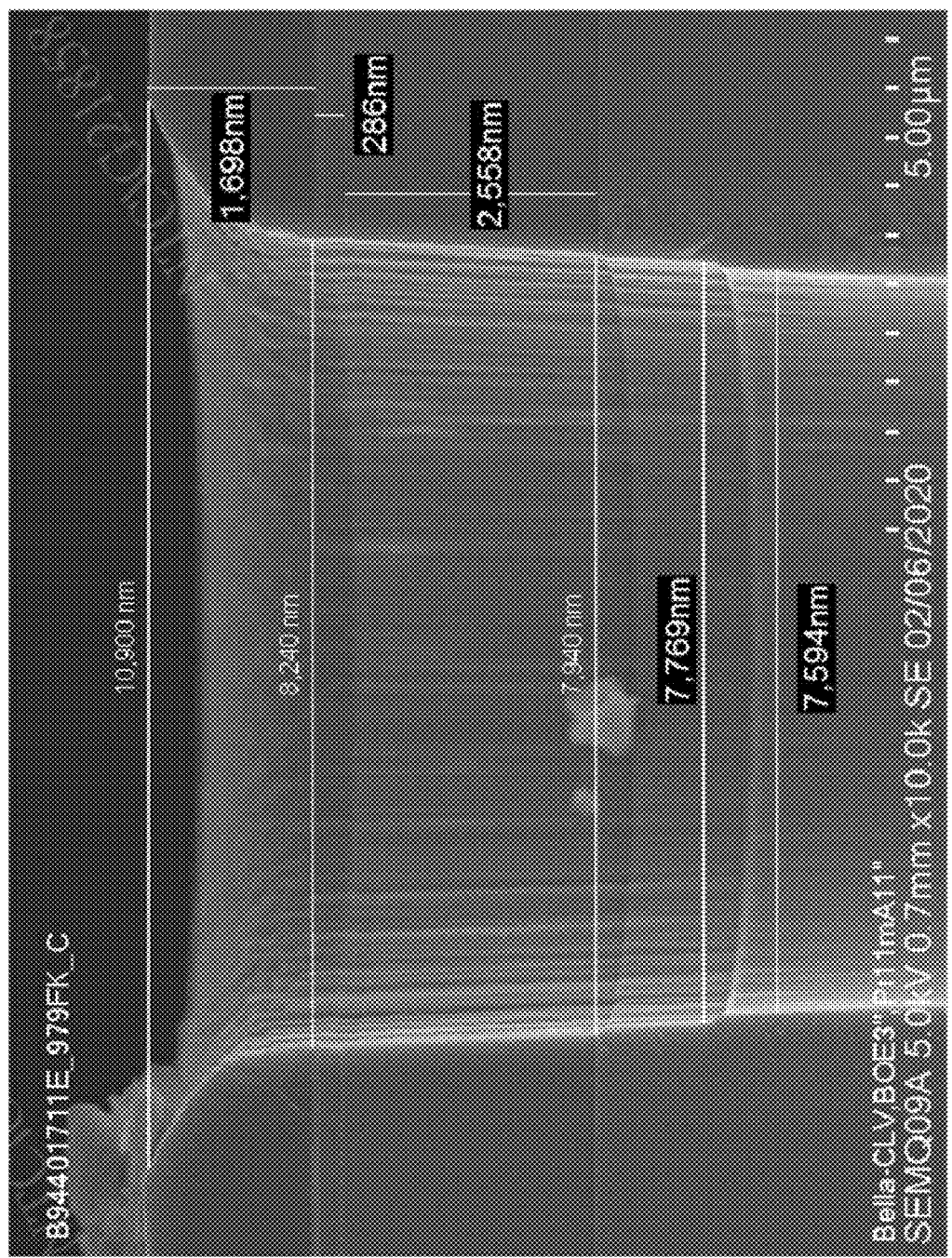
FIG. 2B is an SEM image of a first trench, in accordance with the comparative embodiment.

FIG. 2A is a cross-sectional view of a semiconductor assembly SA1, in accordance with a comparative embodiment. The semiconductor assembly SA1 comprises a first device 1 bonded to a second device 2. Elements of the first device 1 and the second device 2 in FIG. 2A are identical to those of the first device 10 in FIG. 1 with some elements and numerals omitted for brevity. A first trench t1 and a second trench t2 are formed by at least one etching process in the semiconductor assembly SAL. The first trench t1 and the second trench t2 expose sidewall surfaces SW that comprise portions of surfaces within the semiconductor assembly SA1, a portion of a TML 140 of the first device 1, and a portion of a BML 120 of the second device 2. FIG. 2B is an SEM image of the first trench t1, in accordance with the comparative embodiment. The first trench t1 and the second trench t2 are funnel-shaped trenches, as can be seen from the width decreasing from the opening to a greater depth of the first trench t1 in FIG. 2B.

Figure 3A:
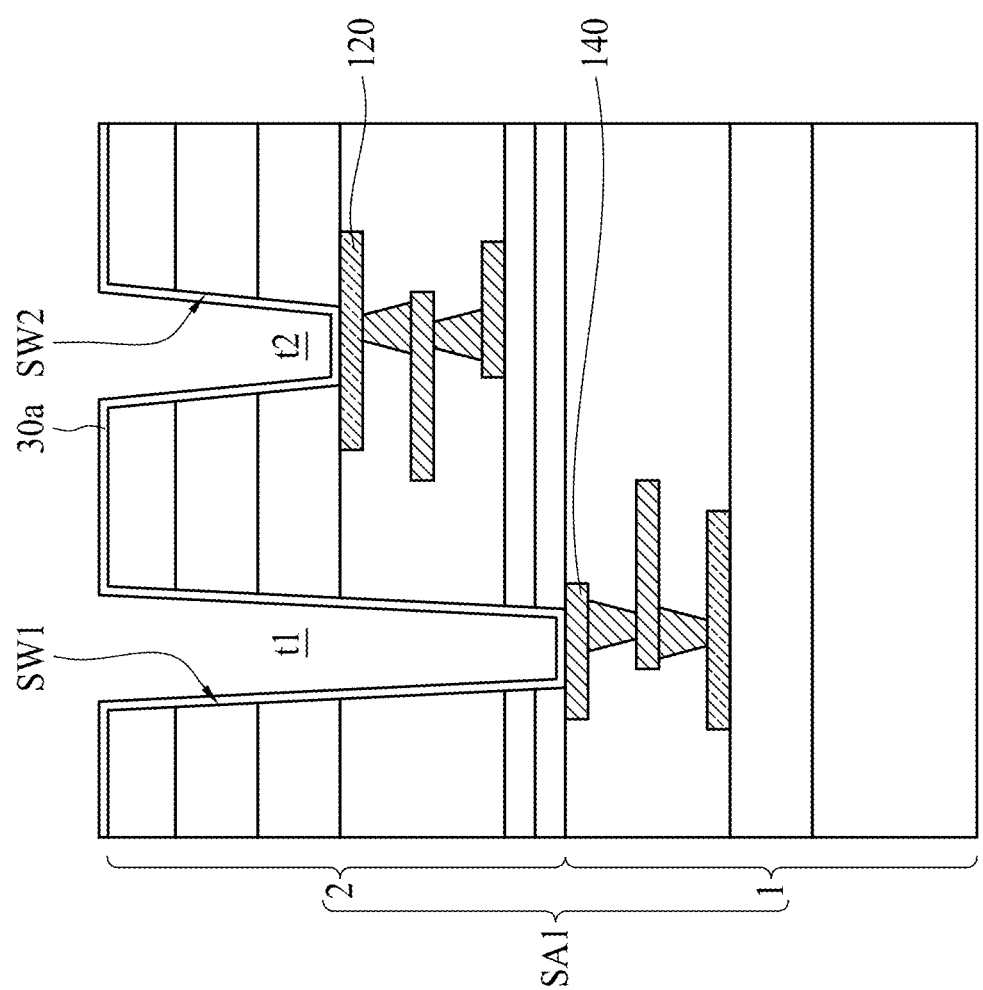
FIG. 3A is a schematic cross-sectional view of the semiconductor assembly after a liner deposition process is performed, in accordance with the comparative embodiment.

FIG. 3A is a schematic cross-sectional view of the semiconductor assembly SA1 after a liner deposition process is performed, in accordance with the comparative embodiment. A liner layer 30a is conformally and uniformly formed on at least the sidewall surfaces SW1 and SW2 exposed by the first trench t1 and the second trench t2, and covers the portion of the BML 120 of the first device 1 and the portion of the TML 140 of the second device 2.

Figure 3B:
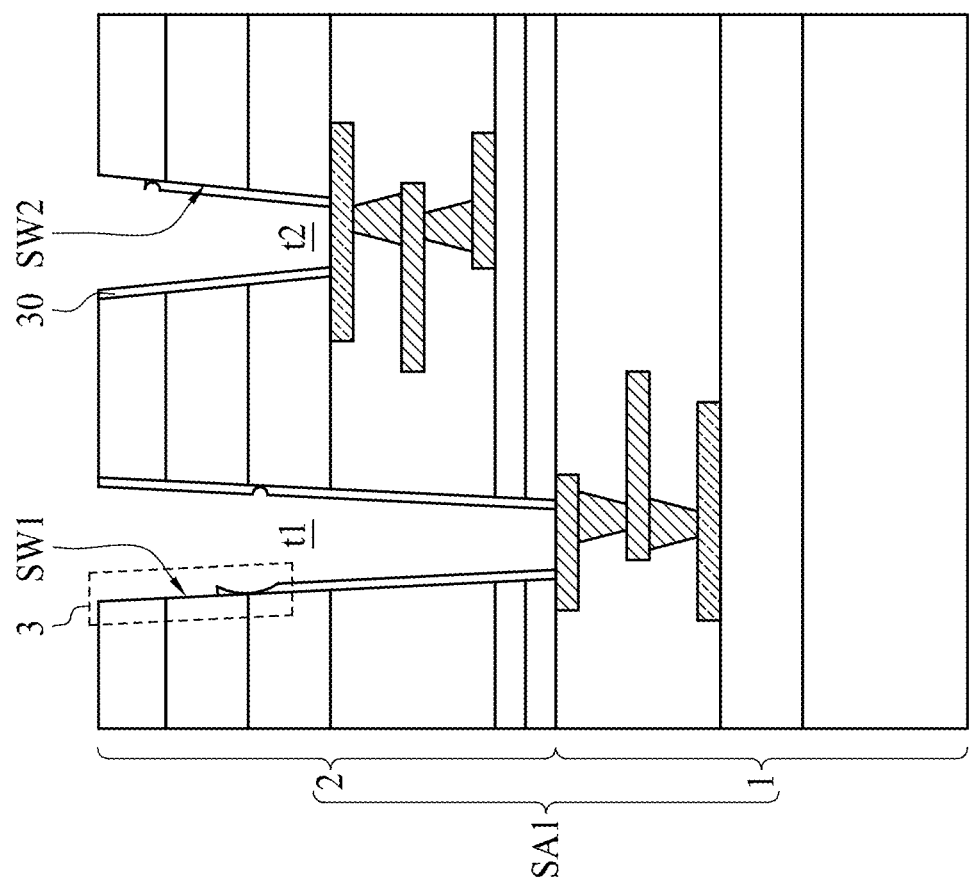
FIG. 3B is a schematic cross-sectional view of the semiconductor assembly after a liner etching process is performed, in accordance with the comparative embodiment.

FIG. 3B is a cross-sectional view of the semiconductor assembly SA1 after a liner etching process is performed. In the liner etching process, the liner layer 30a on the sidewall surfaces SW should remain in place, while the liner layer 30a on other surfaces is completely removed. However, in the comparative embodiment, the liner layer 30a on the sidewall surfaces SW is likely to be overetched. Etchants are likely to excessively consume the liner layer 30a on the sidewall surfaces SW because of the funnel-shaped profile of the first trench t1 and the second trench t2. That is, a liner layer 30 formed on the sidewall surfaces SW1 and SW2 in the comparative embodiment may have cracks 3 and/or may have portions missing, as illustrated in FIG. 3B.

Figure 4:
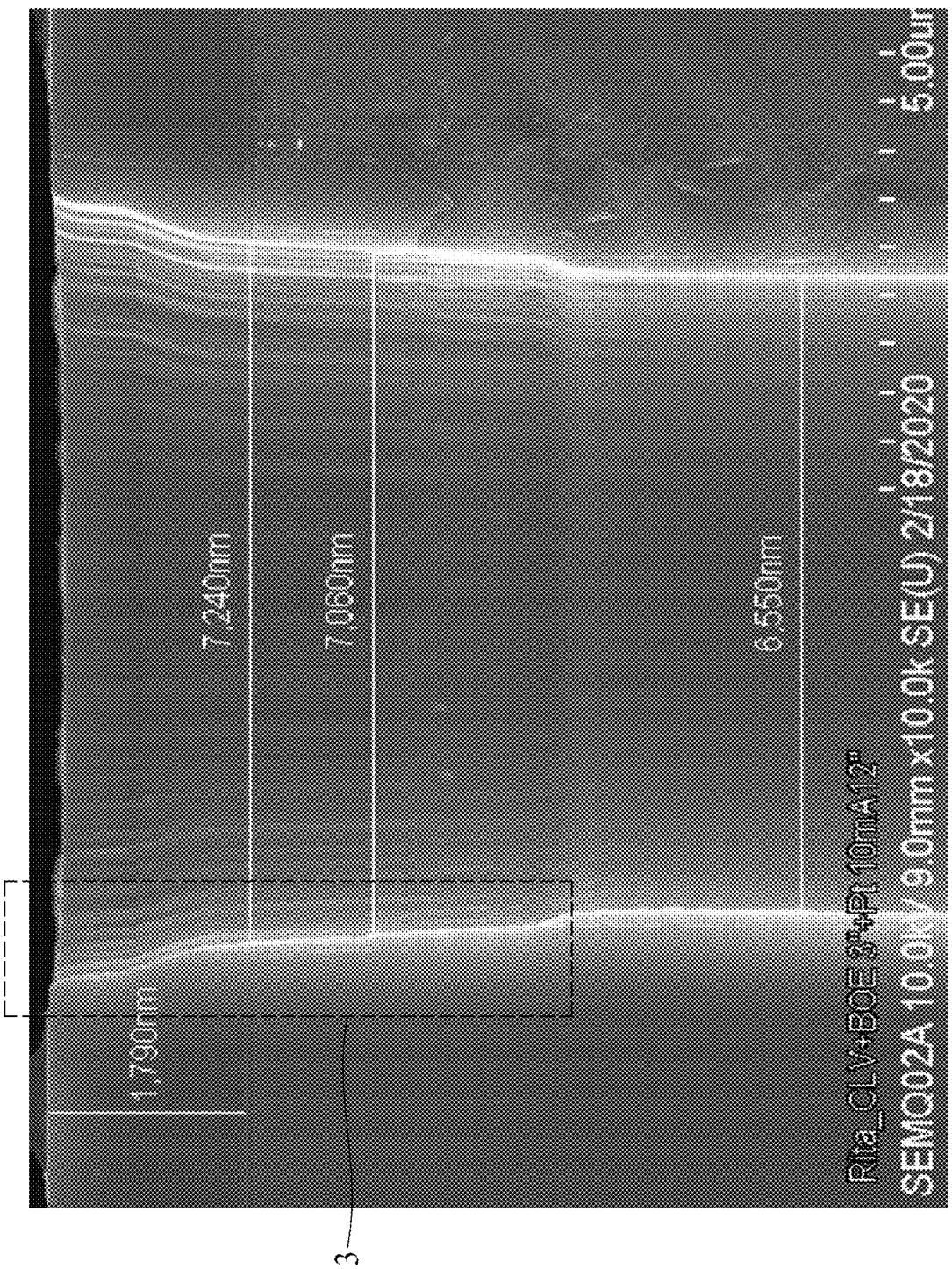
FIG. 4 is an SEM image showing a crack formed in the liner layer, in accordance with the comparative embodiment.

FIG. 4 is an SEM image showing one of the cracks 3 formed in the liner layer 30 (indicated by a circle), in accordance with the comparative embodiment. Due to the fact that the liner layer 30 may not be robustly formed, the liner layer 30 may fail to serve its function. Therefore, there is a need to improve the semiconductor manufacturing process, especially related to the trench formation process.

Figure 5:
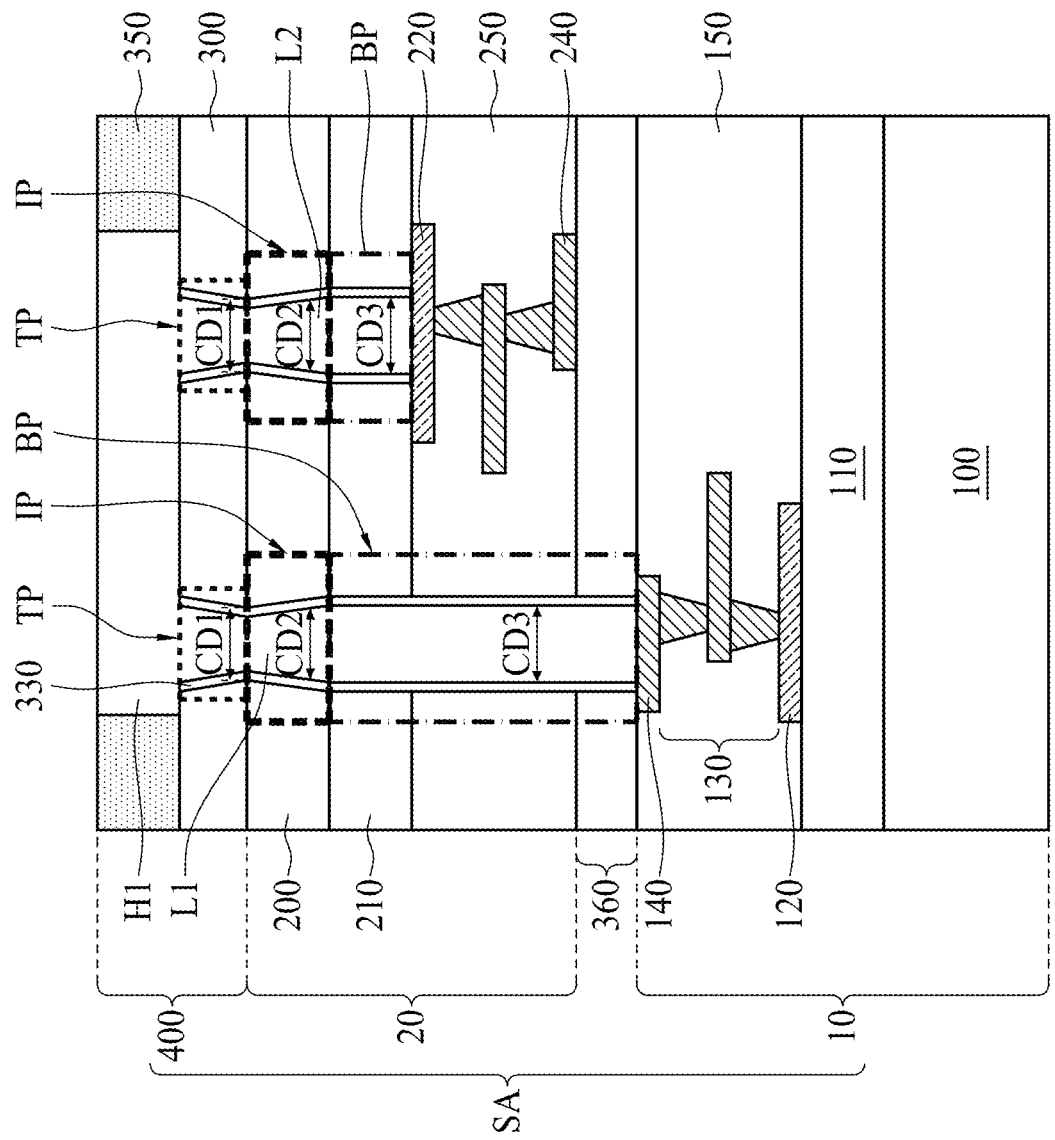
FIG. 5 is a schematic cross-sectional view of a semiconductor assembly, in accordance with some embodiments of the present disclosure.

FIG. 5 is a schematic cross-sectional view of a semiconductor assembly SA, in accordance with some embodiments of the present disclosure. With reference to FIG. 5, the semiconductor assembly SA comprises a first device 10, a second device 20 on the first device 10 and an interconnect structure 400, wherein the second device 20 is electrically coupled to the first device 10 via the interconnect structure 400. The first device 10 comprises a first top metal layer (TML) 140 and the second device 20 comprises a second bottom metal layer (BML) 220. A bonding layer 360 is formed between the first device 10 and the second device 20. A passivation layer 300 is formed on the second device 20, and a protection layer 350 disposed on the passivation layer 300. A liner layer 330 is disposed between the first leg L1 and the bonding layer 360, between the first leg L1 and the second device 20, between the first leg L1 and the passivation layer 300, between the second leg L2 and the second device 20 and between the second leg L2 and the passivation layer 300. The interconnect structure 400, comprising a first leg L1, a second leg L2 and a head member H1, electrically connects the first TML 140 in the first device 10 to the second BML 220 in the second device 20. The first leg L1 is longer than and substantially parallel to the second leg L2. In some embodiments, the head member H1, the first leg L1, and the second leg L2 are integrally formed. The head member H1 penetrates through the protecting layer 350; the first leg L1 connects the head member H1 to the first TML 140; and a second leg L2 connects the head member H1 to the second BML 220. The first leg L1 has a top portion TP penetrating through the passivation layer 300, an intermediate portion IP penetrating through a second substrate 200 of the second device 20, and a bottom portion BP penetrating extending from the intermediate portion IP to the first TML 140. The second leg L2 has a top portion TP penetrating through the passivation layer 300, an intermediate portion IP penetrating through the second substrate 200 of the second device 20, and a bottom portion BP extending from the intermediate portion IP to the second BML 220. The top portions TP of the first leg L1 and the second leg L2 have a first critical dimension CD1 that gradually decreases at positions of increasing distance from the head member H1. The intermediate portions IP of the first leg L1 and the second leg L2 have a second critical dimension CD2 that gradually increases at positions of increasing distance from the head member H1. The bottom portions BP of the first leg L1 and the second leg L2 have a substantially uniform critical dimension CD3.

Figure 6:
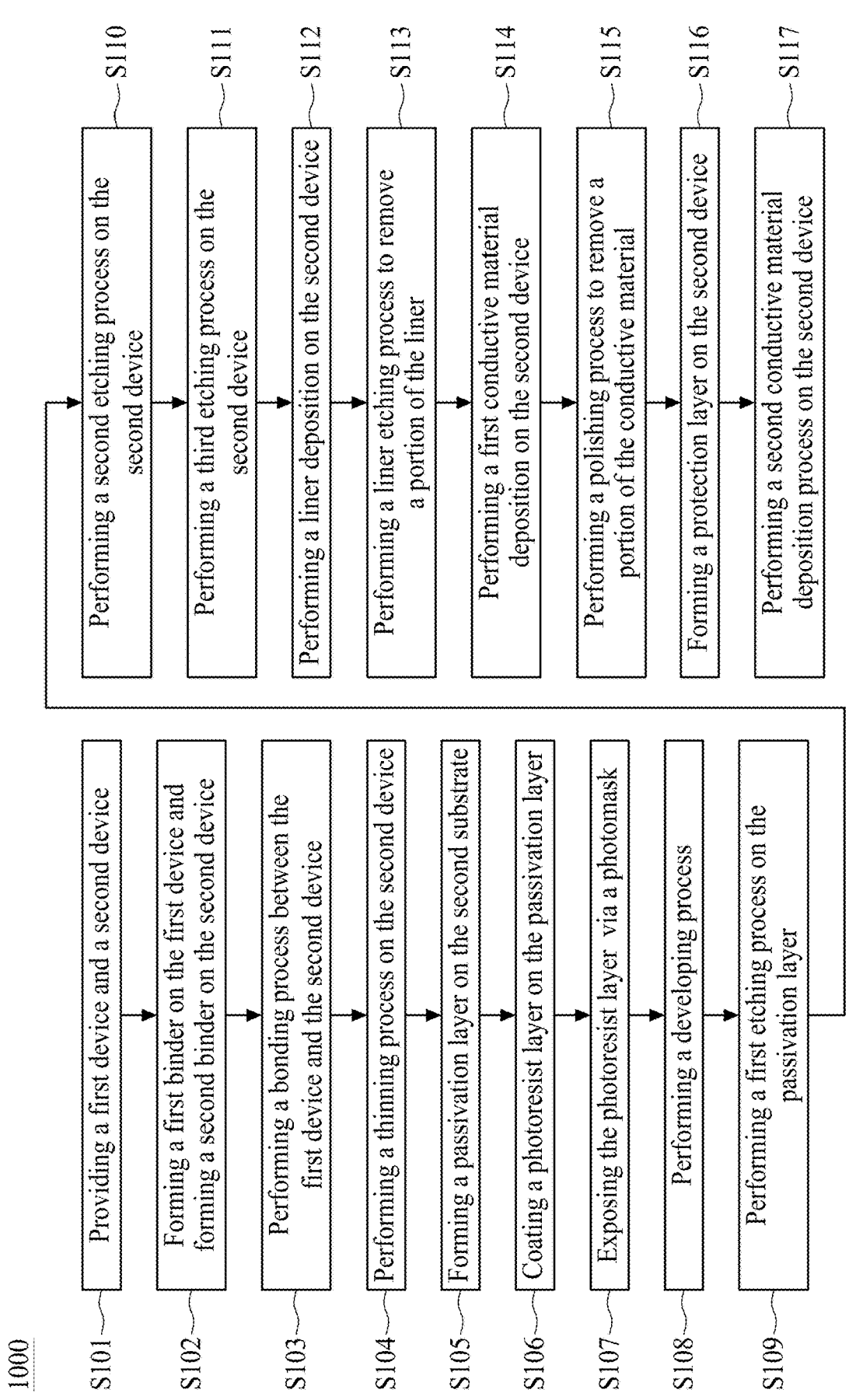
FIG. 6 is a flow diagram showing a method for fabricating the semiconductor assembly in FIG. 5, in accordance with some embodiments of the present disclosure.

FIG. 6 is a flow diagram showing a method 1000 for fabricating the semiconductor assembly SA in FIG. 5, in accordance with some embodiments of the present disclosure. Specifically, the method 1000 includes a TSV process. FIG. 7 to FIG. 25 are cross-sectional views together with some SEM images showing sequential stages according to the method 1000, in accordance with some embodiments of the present disclosure.

Figure 7:
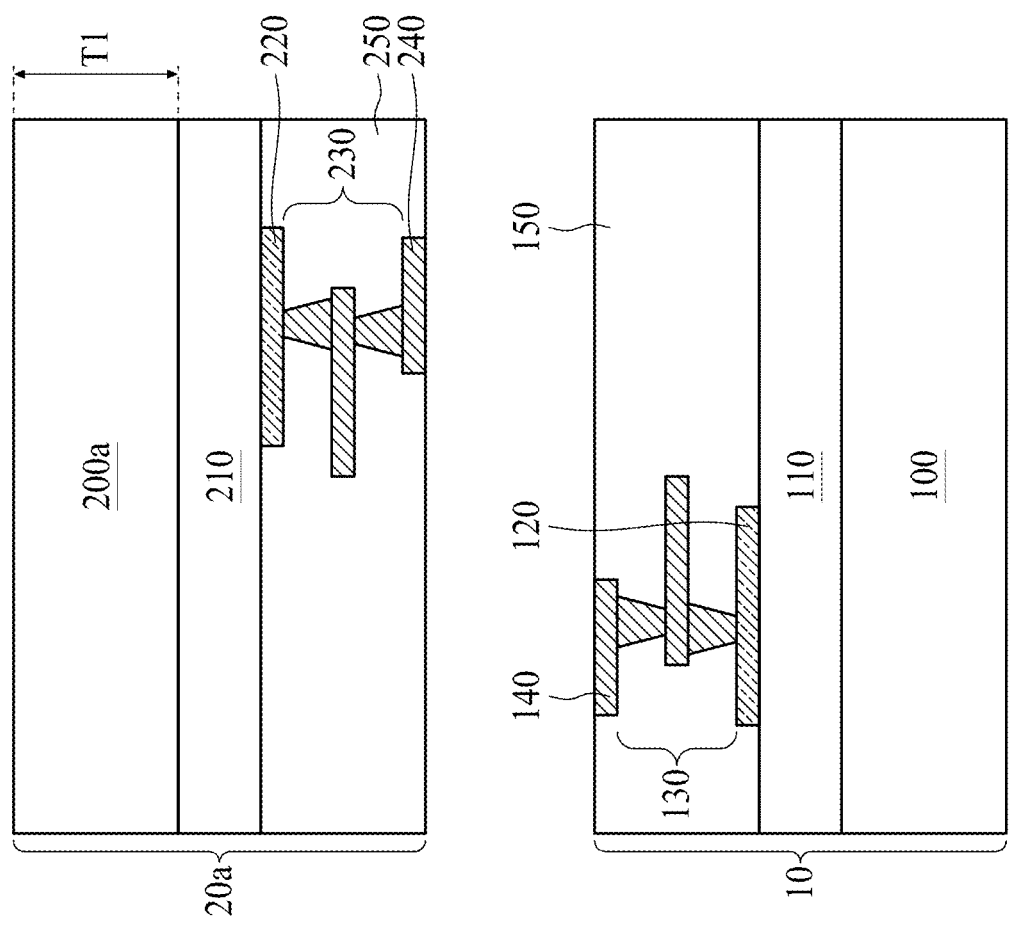
FIG. 7 to FIG. 16 are schematic cross-sectional views showing different steps according to the method in FIG. 6, in accordance with some embodiments of the present disclosure.

With reference to FIG. 7, a first device 10 and a second device 20a are provided according to step S101 in FIG. 6. Elements and numerals of the first device 10 in FIG. 7 are identical to those of the first device 10 in FIG. 1 with some elements omitted for brevity. In some embodiments, the second device 20a may be a memory device. The second device 20a comprises a second substrate 200a, a second dielectric layer 210, a second BML 220, a second MLI 230, a second TML 240 and a second IMD 250. A second main component (not shown) and a second conductive plug (not shown) are embedded in the second dielectric layer 210. In some embodiments, the elements of the second device 20a are essentially the same as the counterparts of the first device 10 and repeated description of similar elements is omitted for brevity. In some embodiments, the second substrate 200a has a thickness T1 of about 775 μm.

Figure 8:
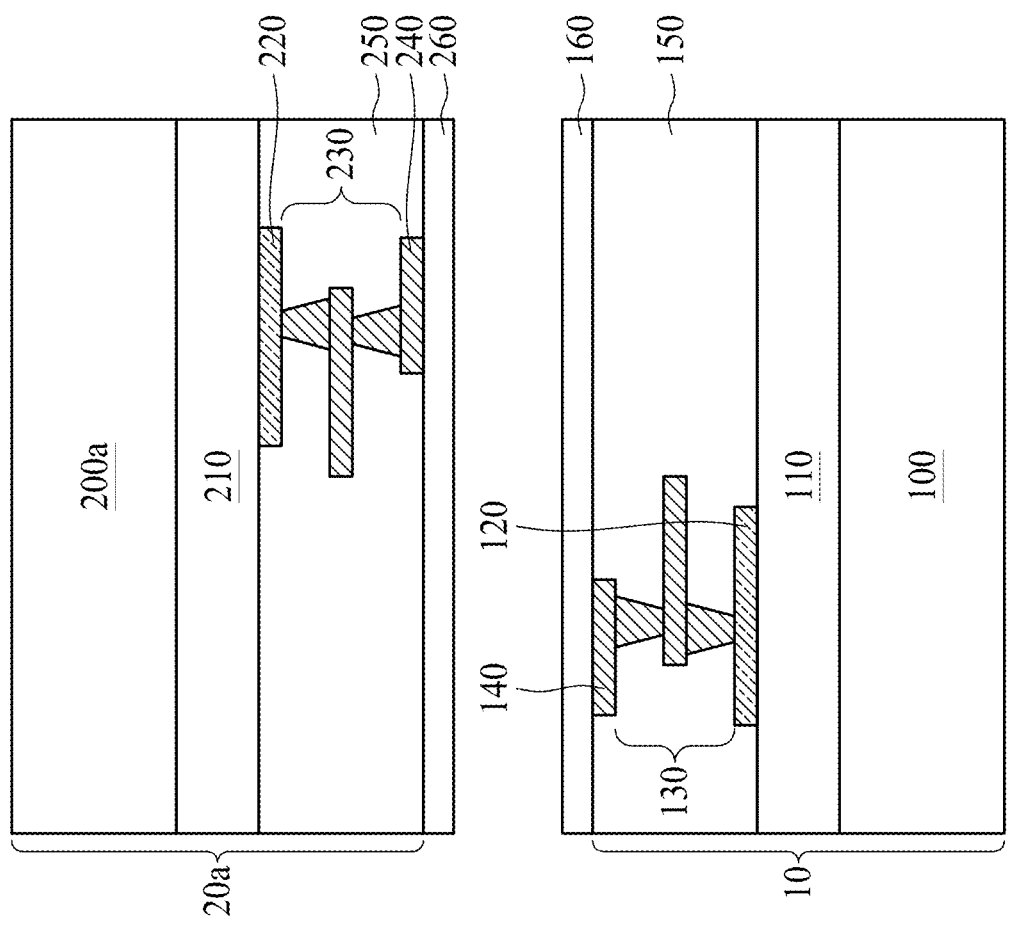

With reference to FIG. 8, a first binder 160 and a second binder 260 are respectively formed on the first device 10 and on the second device 20a according to step S102 in FIG. 6. The first binder 160 and the second binder 260 are used as a bonding interface between the first device 10 and the second device 20a. In some embodiments, the first binder 160 fully covers the first TML 140 and a surface of the first IMD 150. The second binder 260 fully covers the second TML 240 and a surface of the second IMD 250. In some embodiments, the first binder 160 and the second binder 260 are a dielectric film formed by a plasma-enhanced CVD process or a spin-coating process.

Figure 9:
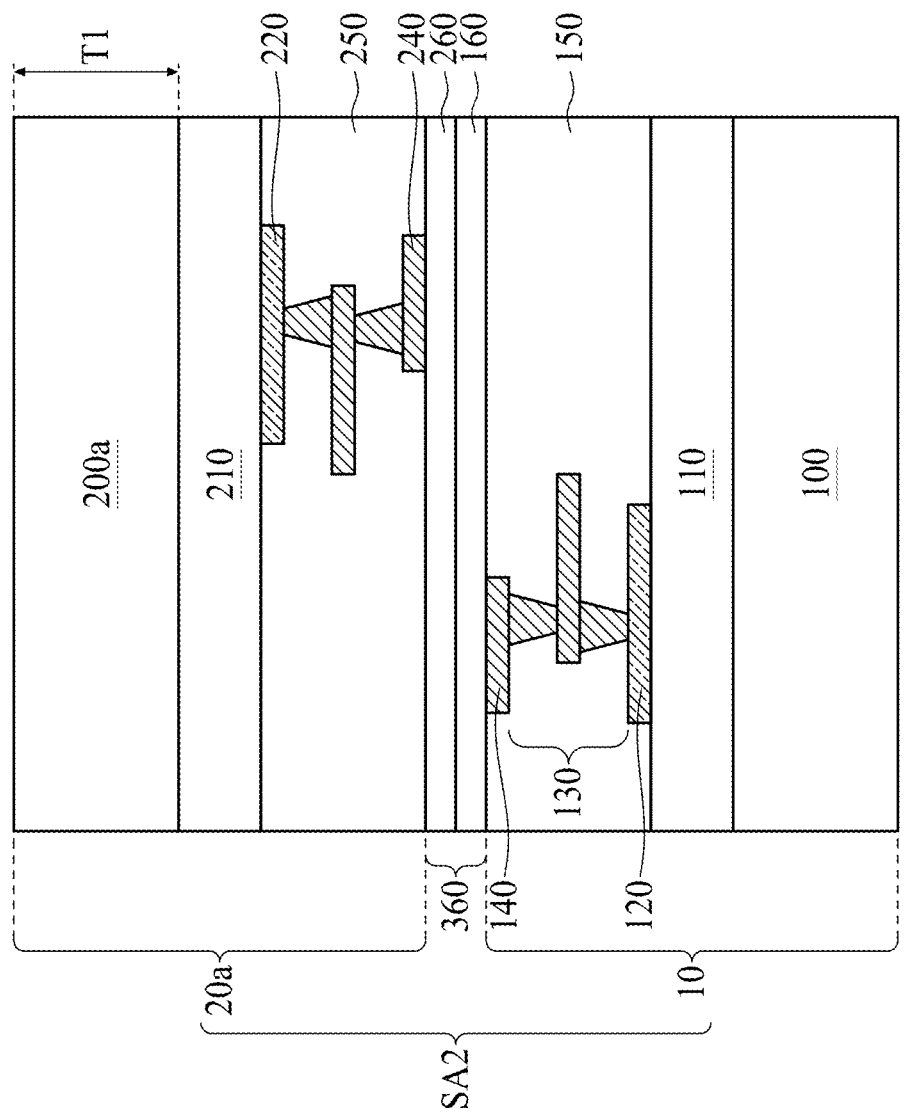

With reference to FIG. 9, a bonding process is performed on the first device 10 and the second device 20a according to step S103 in FIG. 6. Specifically, before the bonding process is performed, an alignment process is performed to precisely align the second binder 260 with the first binder 160. In some embodiments, the alignment process may include an optical alignment or a mechanical alignment. Subsequently, the first binder 160 and the second binder 260 are brought into contact to begin a dielectric-to-dielectric bonding process. The first device 10 and the second device 20a are vertically stacked in a front-to-front configuration. Next, an anneal process is performed to fuse the first binder 160 and the second binder 260 into a bonding layer 360 so as to strengthen the bonding interaction. As a result, a semiconductor assembly SA2 which comprises the first device 10 and the second device 20a is formed. In some embodiments, the semiconductor assembly SA2 may be a memory stack.

Figure 10:
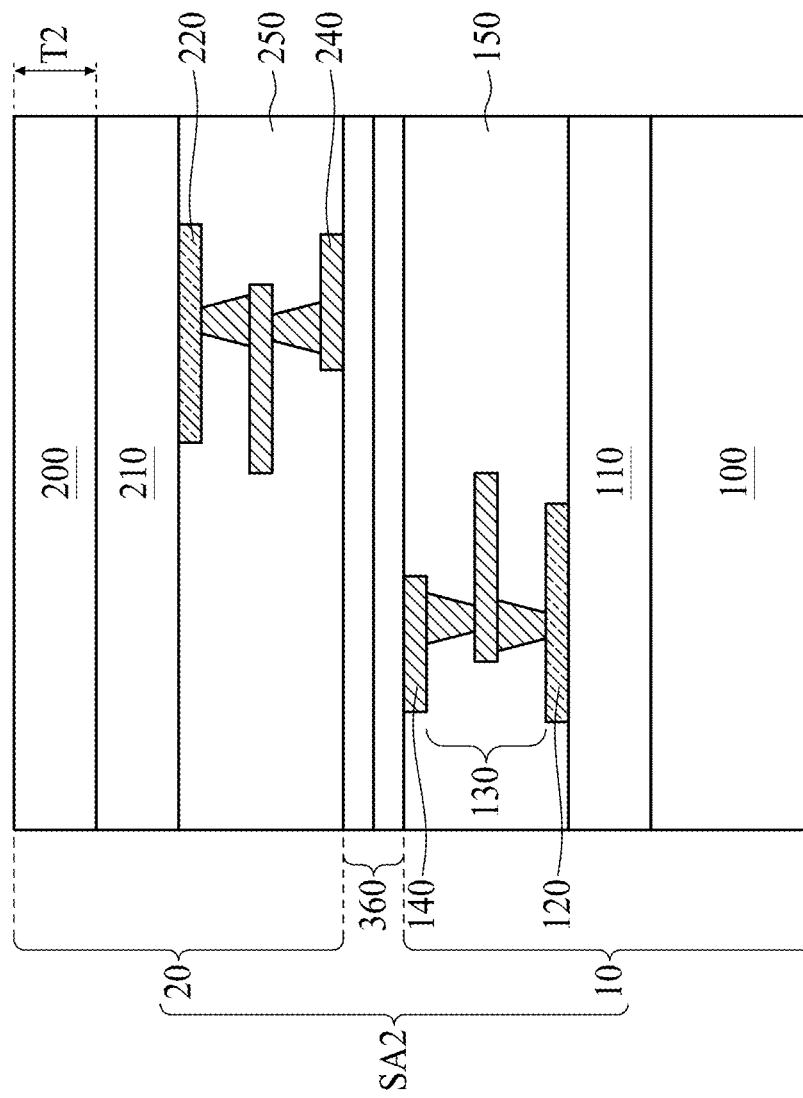

With reference to FIG. 10, a thinning process is performed on the second device 20a according to step S104 in FIG. 6. In some embodiments, the second substrate 200a is thinned to a thickness T2 of about 10 to 50 μm. In a preferred embodiment of the present disclosure, the thickness T2 is about 30 μm. Therefore, a second device 20 comprising a second substrate 200 with the reduced thickness T2 is formed. The purpose of thinning the second substrate 200a is to reduce the fabrication time for the subsequent processes. In some embodiments, the thinning process may be implemented using a suitable technique such as a grinding process, a polishing process and/or a chemical etching process.

Figure 11:
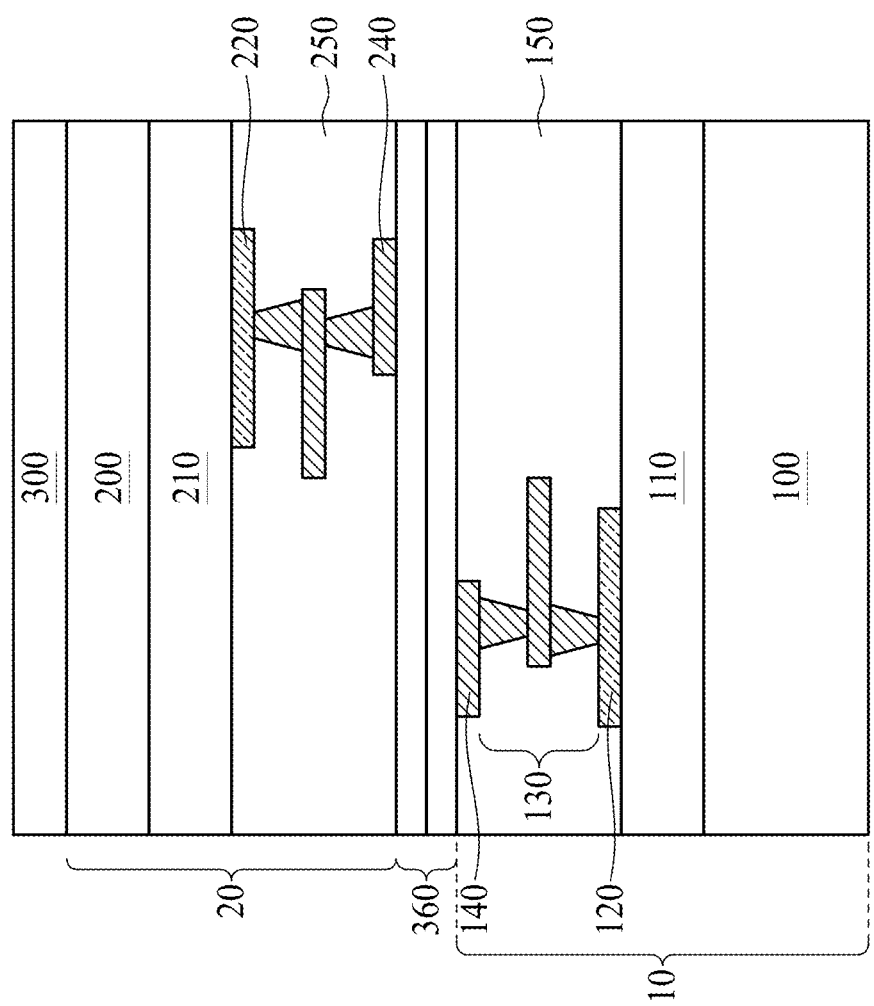

With reference to FIG. 11, a passivation layer 300 is formed on the second device 20 according to step S105 in FIG. 6. In some embodiments, the method of forming the passivation layer 300 can include a CVD process, a spin-coating process, or another suitable process that can form a dielectric material. In some embodiments, the material of the passivation layer 300 may include silicon oxide ($SiO_2$), silicon nitride (SiN), silicon oxynitride (SiON) or the like.

Figure 12:
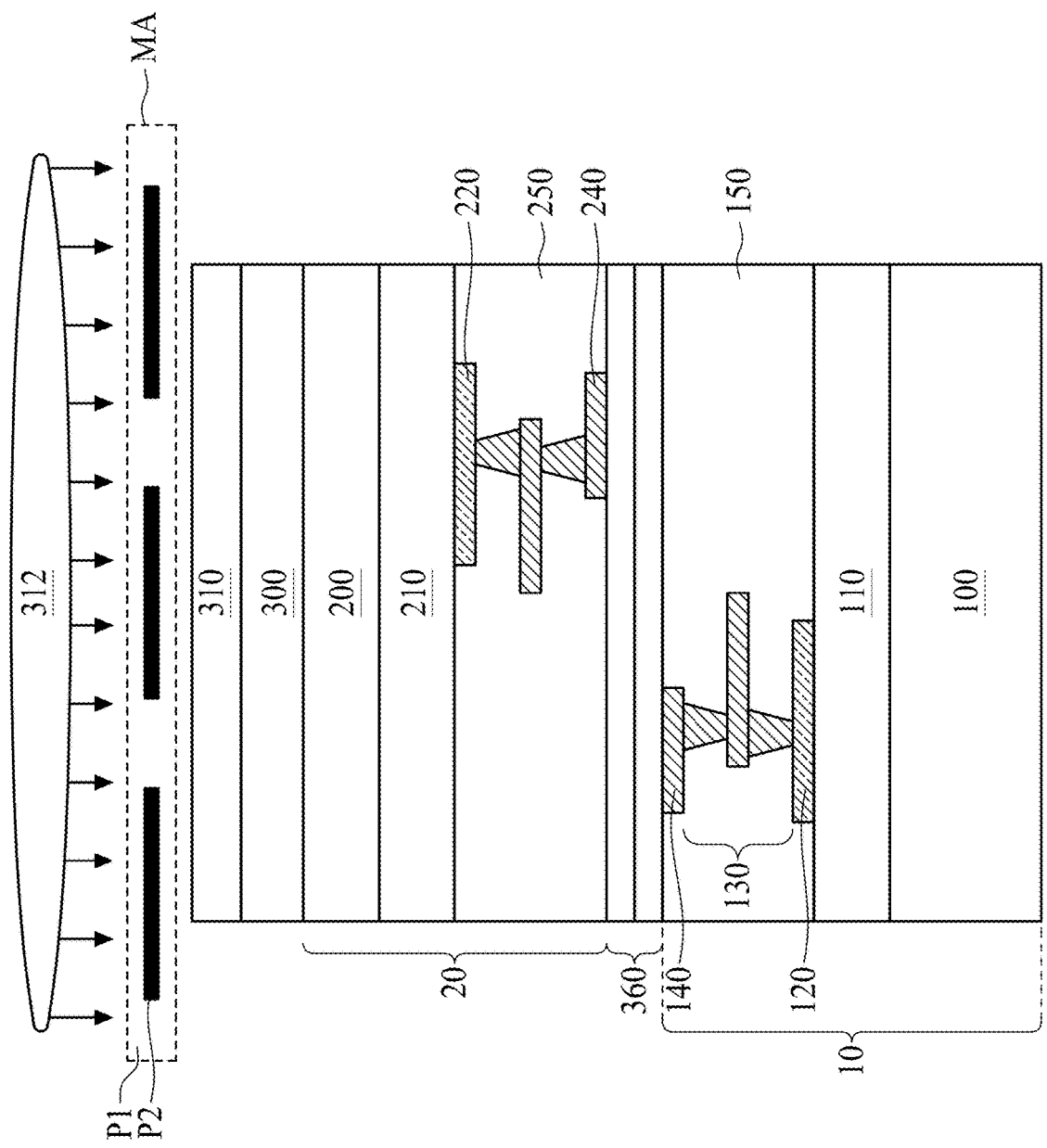

With reference to FIG. 12, a photoresist layer 310 is coated on the passivation layer 300 according to step S106 in FIG. 6. The photoresist layer 310 completely covers the passivation layer 300. Still referring to FIG. 12, the photoresist layer 310 is exposed to a deep ultraviolet (DUV) light 312 through a photomask MA according to step S107 in FIG. 6. The photomask MA comprises transparent portions P1 and opaque portions P2. The exposure induces a photochemical reaction that changes a chemical property of a portion of the photoresist layer 310. For example, the photoresist layer 310 corresponding to the transparent portions P1 is exposed and may be reactive to a developing agent. In some embodiments, a baking process is performed after the photoresist layer 310 is exposed.

Figure 13:
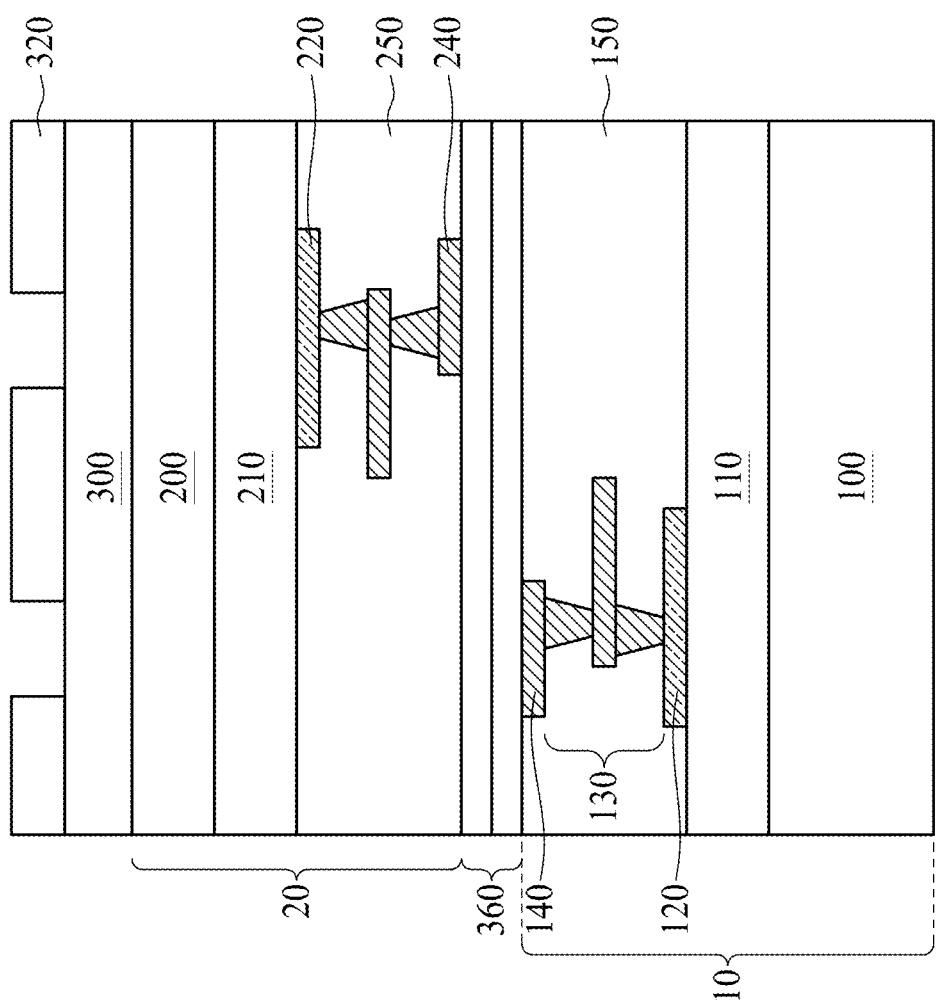

With reference to FIG. 13, a developing process is performed on the photoresist layer 310 according to step S108 in FIG. 6. In some embodiments, an appropriate developing agent is used to rinse the photoresist layer 310. The photoresist layer 310 corresponding to the transparent portions P1 may react with the developing agent and can be easily removed. After the developing process is performed, a photoresist pattern 320 remains on the passivation layer 300.

Figure 14:
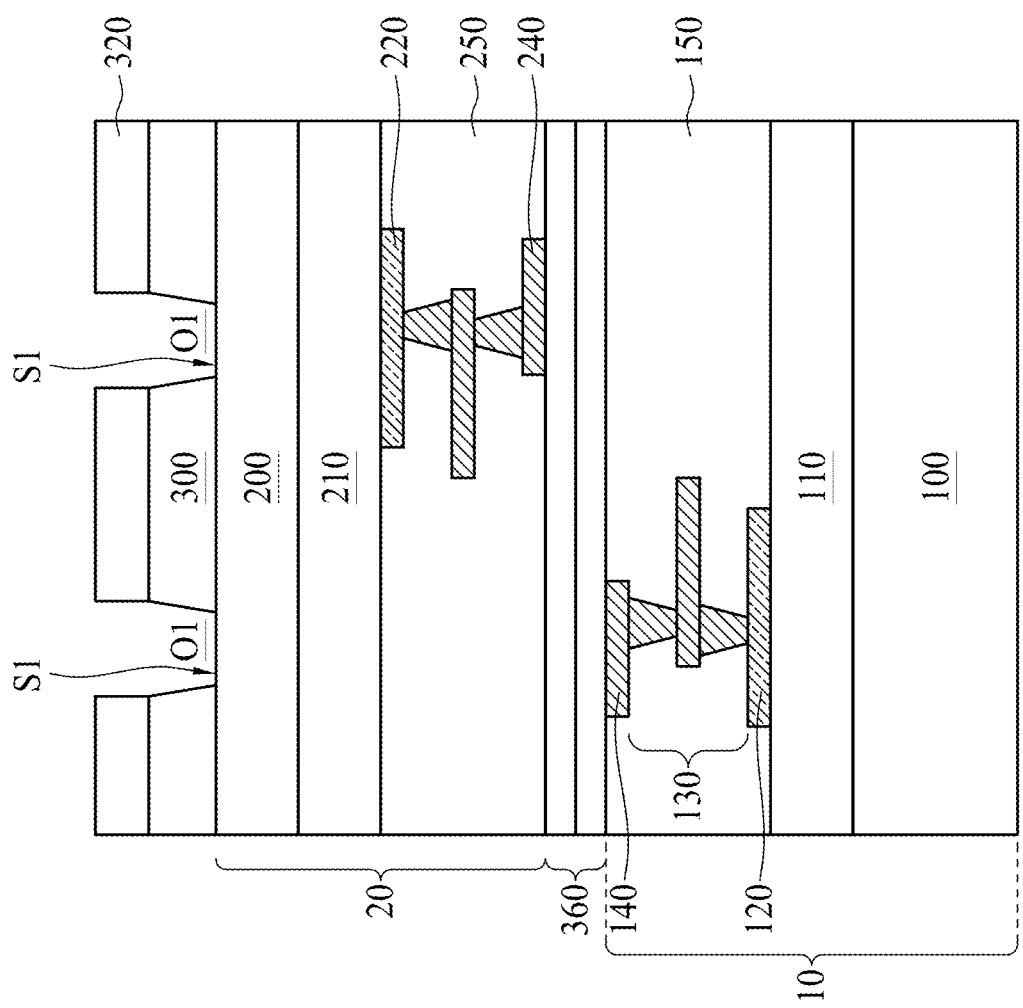

With reference to FIG. 14, a first etching process is performed on the passivation layer 300 according to step S109 in FIG. 6. In some embodiments, the first etching process is a reactive ion etching (RIE). The passivation layer 300 is etched using the photoresist pattern 320 as an etching mask. The etchant is selected according to the material being etched. In some embodiments, an octafluorocyclobutane ($C_4F_8$) gas is used as the etchant when the passivation layer 300 undergoes etching. In some embodiments, parameters of the first etching process such as flow rate, etching time or temperature may be adjusted so as to get a preferred etching profile of the passivation layer 300. After the first etching process is performed, openings O1 are formed in the passivation layer 300. In some embodiments, the openings O1 have a funnel-shaped profile. The openings O1 expose surfaces S1 of the second substrate 200.

Figure 15:
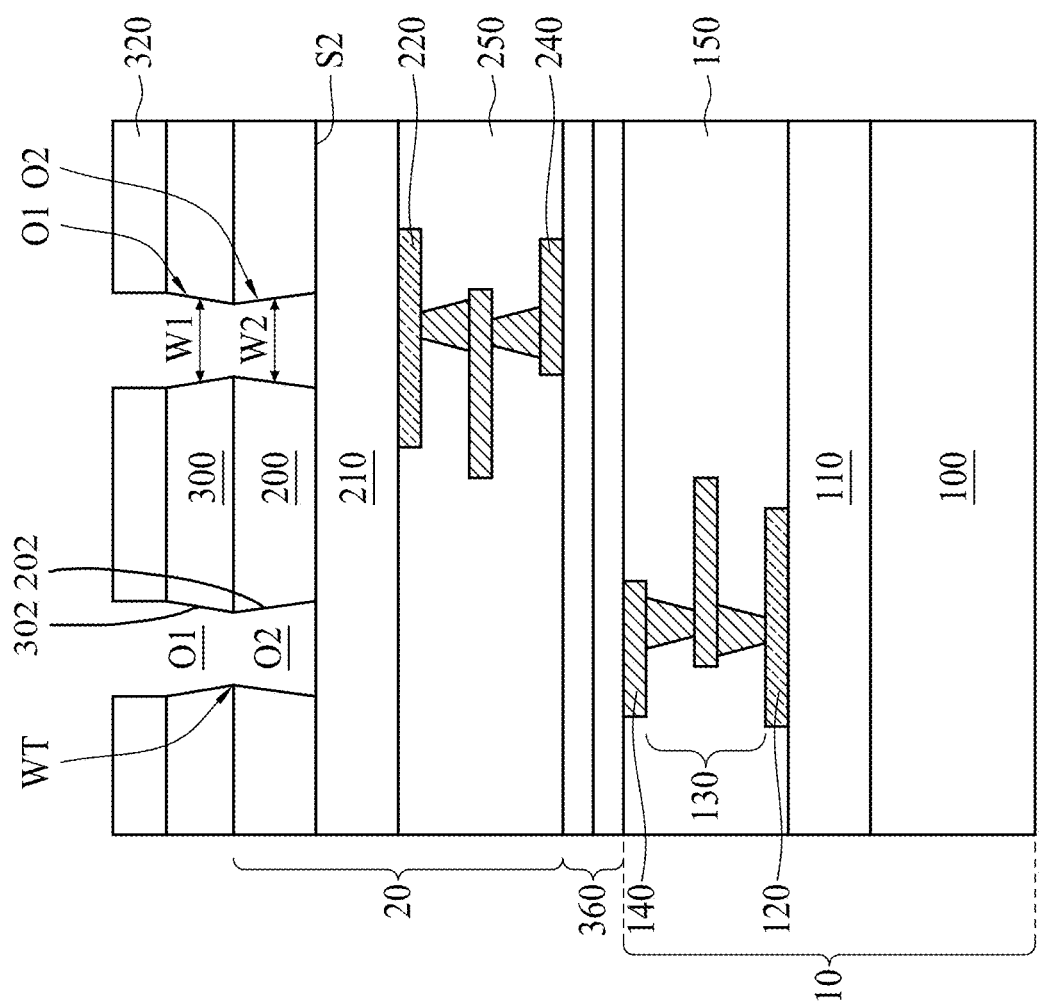
Figure 16:
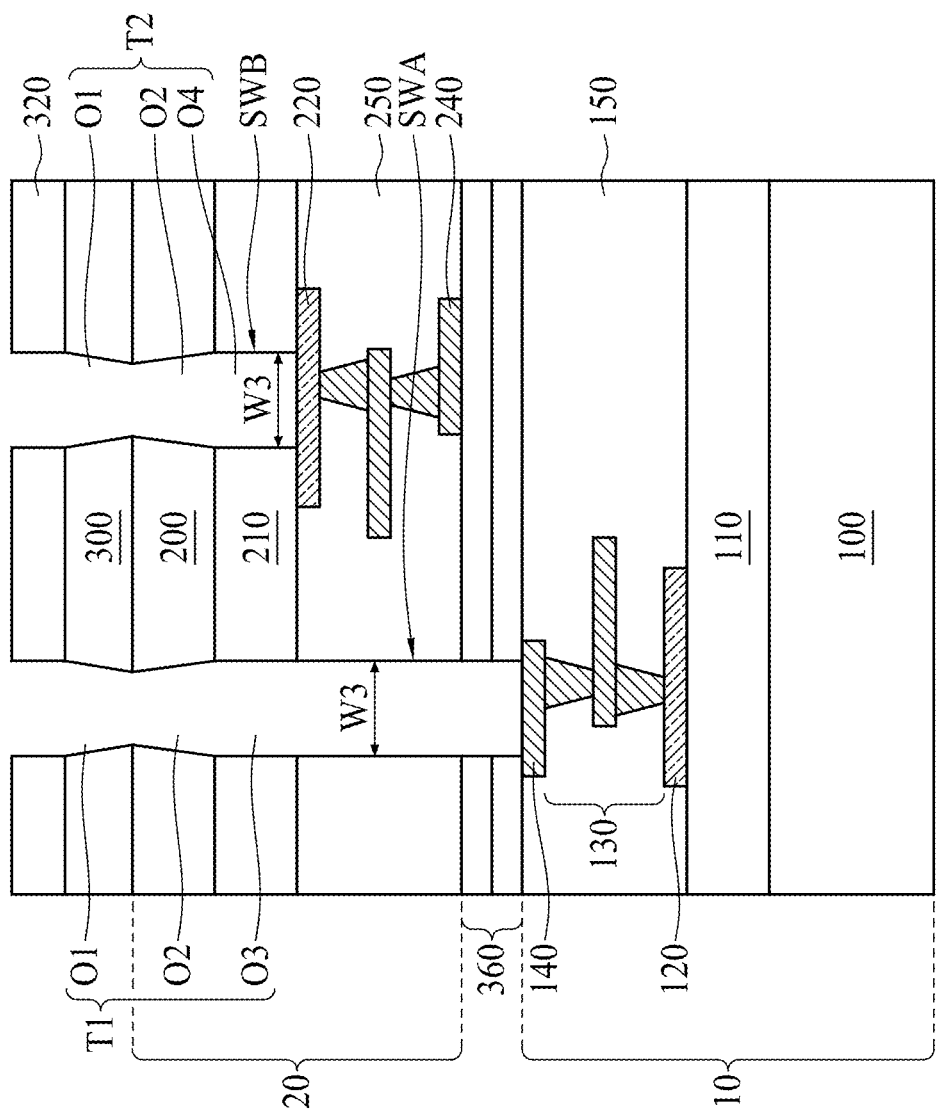

With reference to FIG. 15, a second etching process is performed on the second device 20 according to step S110 in FIG. 6. In some embodiments, the second etching process is an RIE process. In some embodiments, a sulphur hexafluoride ($SF_6$) gas is used as the etchant when the second substrate 200 undergoes etching. In some embodiments, parameters of the second etching process, such as flow rate, etching time or temperature, may be adjusted so as to get a preferred etching profile of the second substrate 200. After the second etching process is performed, openings O2 are formed in the second substrate 200. The openings O2 are connected to the openings O1. In some embodiments, the openings O2 have a frustoconical shape. The openings O2 expose surfaces S2 of the second dielectric layer 210. In addition, the openings O1 have a first width W1 that gradually decreases at positions of decreasing distance from the first device 10; the openings O2 have a second width W2 that gradually increases at positions of decreasing distance from the first device 10. As shown in FIG. 15, surfaces 302 of the passivation layer 300 exposed by the first openings O1 are discontinuous with surfaces 202 of the second device 200 exposed by the second openings O2. In some embodiments, a waist portion WT is formed between the opening O1 and the opening O2. Specifically, the waist portion WT lies at the level of the interface between the passivation layer 300 (an oxide-containing material) and the second substrate 200 (a silicon-containing material). With reference to FIG. 16, a third etching process is performed on the second device 20 according to step S111 in FIG. 6. In some embodiments, the third etching process is an RIE process. In some embodiments, a $C_4F_8$ gas is used as the etchant in the third etching process. In some embodiments, parameters of the third etching process, such as flow rate, etching time or temperature, may be adjusted so as to get a preferred etching profile. The third etching process removes a portion of the second dielectric layer 210, a portion of the second IMD 250 and a portion of the bonding layer 360 that are not protected by the photoresist pattern 320. In some embodiments, the third etching process stops at the first TML 140 and the second BML 220 because the $C_4F_8$ gas is not reactive to metal material therein. After the third etching process is performed, an opening O3 and an opening O4 are formed. The opening O3 is connected to one of the openings O2, and the opening O4 is connected to the other of the openings O2. The opening O3 exposes a portion of the first TML 140 and the opening O4 exposes a portion of the second BML 220. In some embodiments, the opening O3 and the opening O4 have a cylindrical profile with a fixed width W3. In some embodiments, the opening O1, the opening O2 and the opening O3 collectively form a first trench T1, and the opening O1, the opening O2 and the opening O4 collectively form a second trench T2. The first trench T1 and the second trench T2 have different depths. Still referring to FIG. 16, the first trench T1 exposes a sidewall surface SWA which comprises portions of surfaces within the passivation layer 300, the second substrate 200, the second dielectric layer 210, the second IMD 250 and the bonding layer 360. The second trench T2 exposes a sidewall surface SWB which comprises portions of surfaces within the passivation layer 300, the second substrate 200 and the second dielectric layer 210. In some embodiments, the first, second and third etching processes may be performed in the same etching chamber by sequentially changing the etchant. In other embodiments, the first, second and third etching processes may be performed in different etching chambers. After the third etching process is performed, the photoresist pattern 320 is removed, for example, by an ashing process or a wet strip process.

Figure 17:
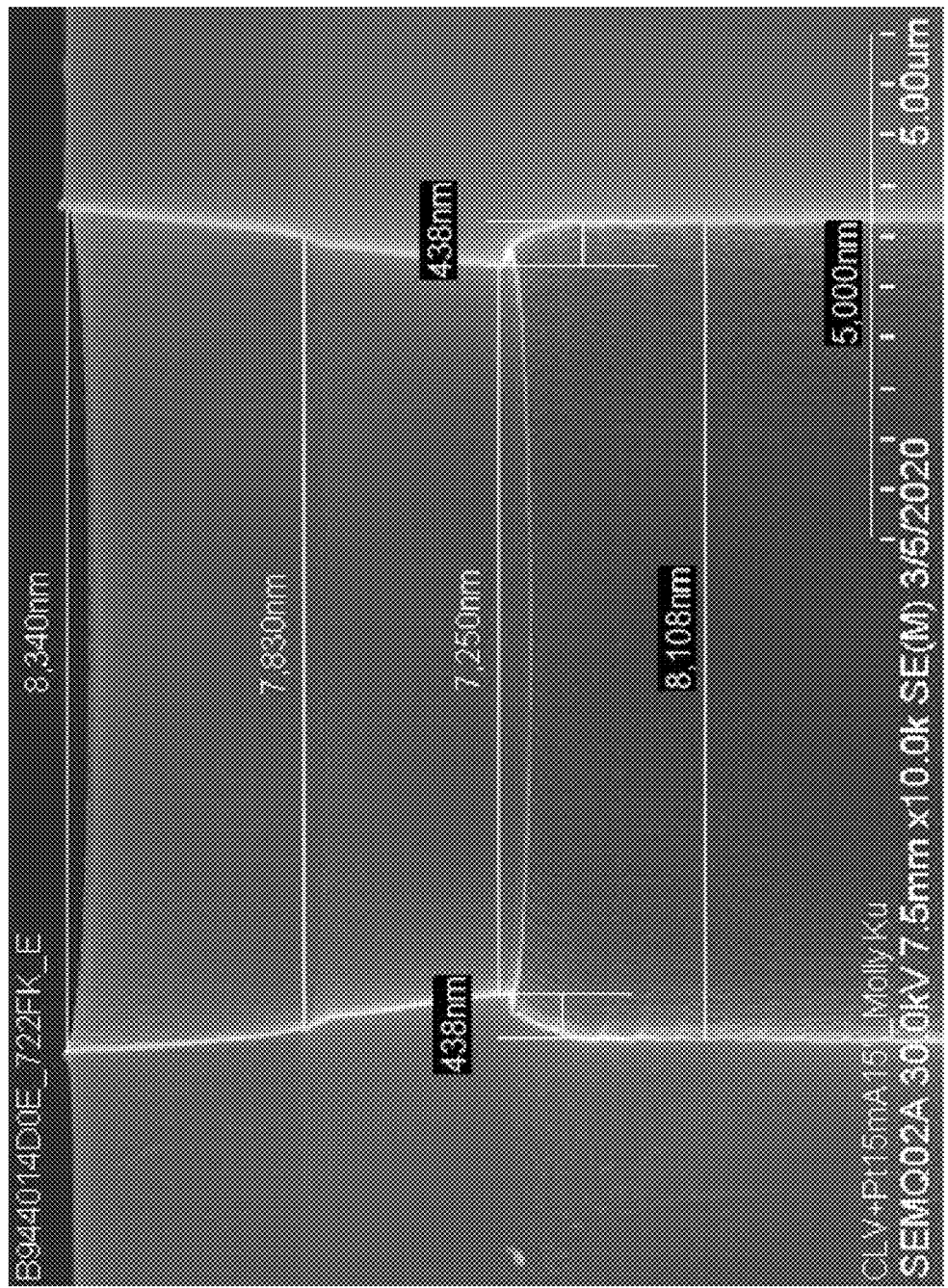
FIG. 17 is an SEM image showing a waist portion after a third etching process is performed, in accordance with an embodiment of the present disclosure.

FIG. 17 is an SEM image showing the waist portion WT after the third etching process is performed. In an embodiment of the present disclosure, the width of the waist portion WT is about 7250 nm. The portion of the trench T1 or T2 above the waist portion WT is the top portion TP. The width of the top portion TP decreases from about 8430 nm to a minimum value of about 7250 nm as the depth of the trench T1 or T2 increases. The portion of the trench T1 or T2 below the waist portion WT is the bottom portion BP. The width of the bottom portion BP increases from about 7250 nm to a maximum value of about 8108 nm as the depth of the trench T1 or T2 increases.

Figure 18:
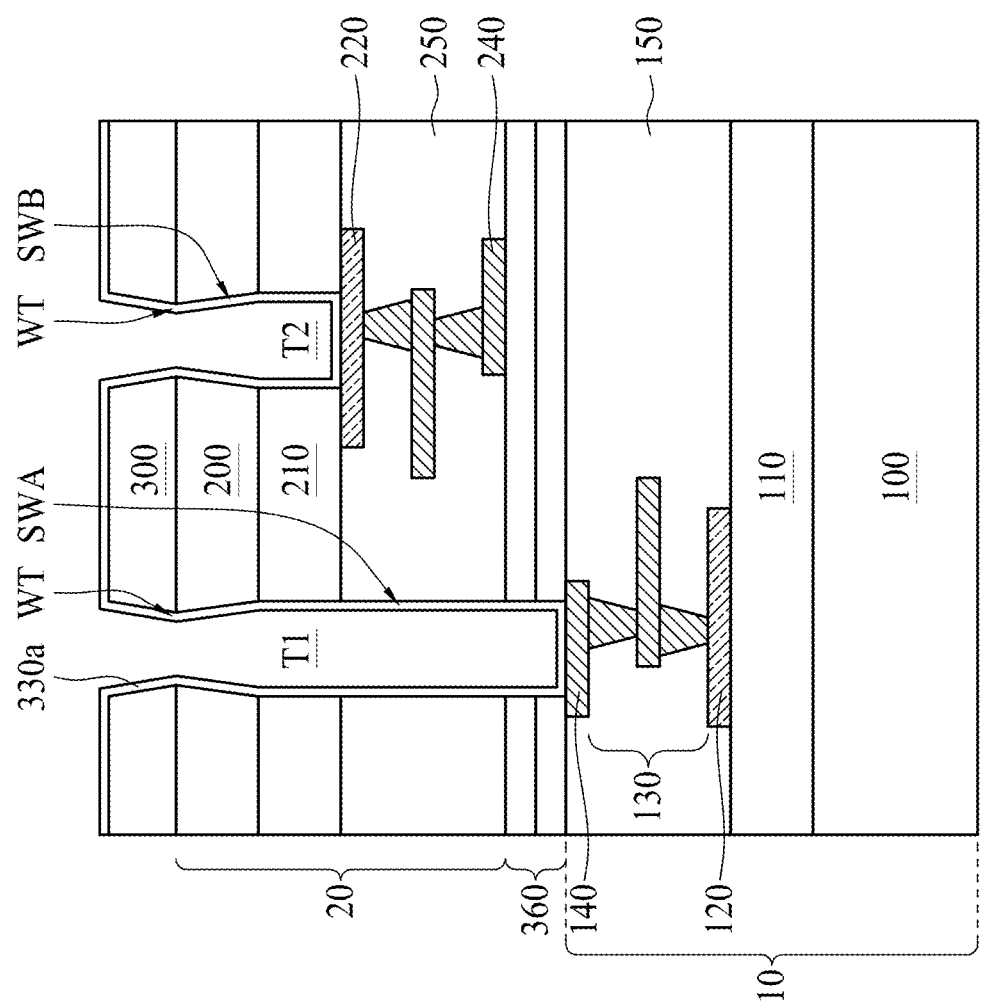
FIG. 18 to FIG. 19 are schematic cross-sectional views showing different steps according to the method in FIG. 6, in accordance with some embodiments of the present disclosure.

With reference to FIG. 18, a liner deposition is performed on the second device 20 according to step S112 in FIG. 6. In some embodiments, a liner layer 330a is conformally and uniformly formed on the passivation layer 300, in the first trench T1 and in the second trench T2. In some embodiments, the liner deposition employs an atomic layer deposition (ALD). The liner layer 330a covers a portion of the passivation layer 300, a portion of the first TML 140 and a portion of the second BML 220. In addition, the liner layer 330a covers the sidewall surfaces SWA and SWB. In some embodiments, the liner layer 330a may be made of phosphosilicate glass formed from precursors from the group consisting of TEOS, $SiH_4$, $PH_3$ and $B_2H_6$.

Figure 19:
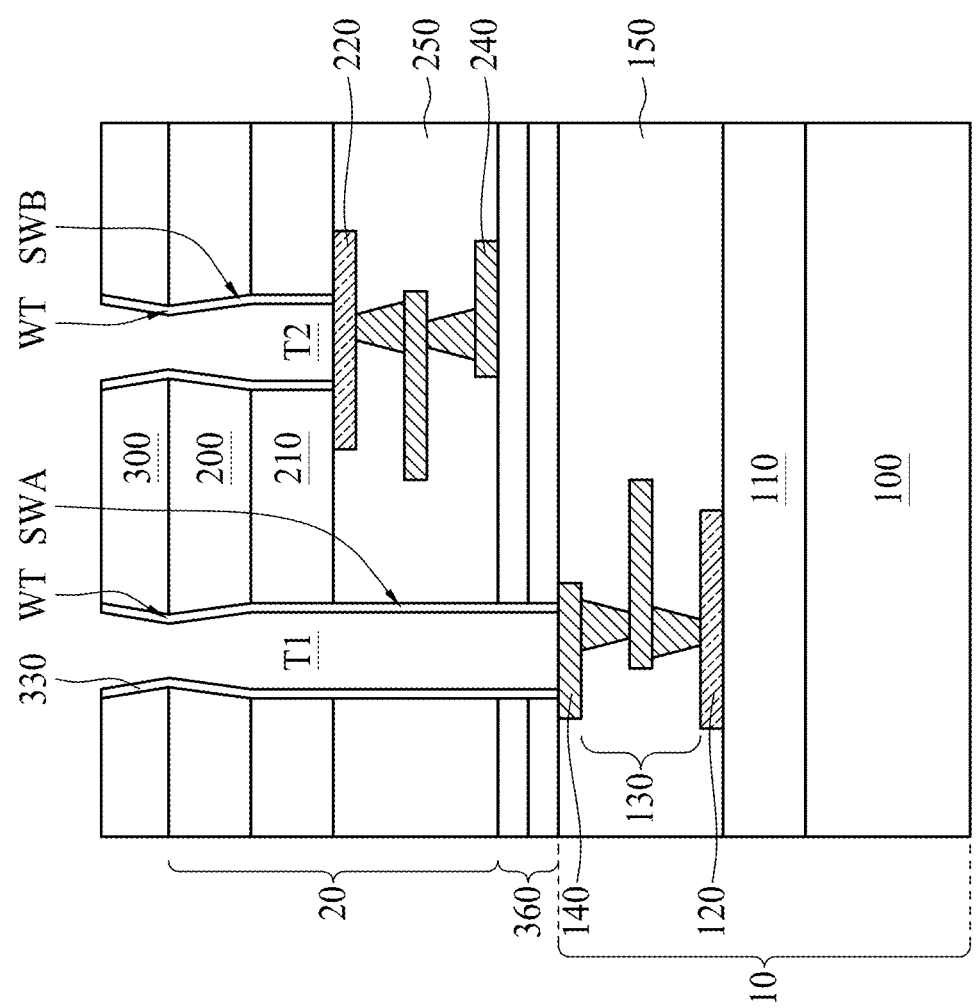

With reference to FIG. 19, a liner etching process is performed on the liner layer 330a according to step S113 in FIG. 6. Specifically, portions of the liner layer 330a on the passivation layer 300, on the first TML 140 and on the second BML 220 are completely removed while the liner layer 330a on the sidewall surfaces SWA and SWB remains in place. As a result, in an embodiment of the present disclosure, a liner layer 330 on the sidewall surfaces SWA and SWB is formed. Thus, the present embodiment compares favorably to the comparative embodiment, in which the liner layer 30a on the sidewall surfaces SW1 and SW2 is likely to be overetched due to the funnel-shaped profile of the first trench t1 and the second trench t2. As a result, in the comparative embodiment, the liner layer 30 may have cracks and/or may be missing. In an embodiment of the present disclosure, the waist portions WT prevent the first trench T1 and the second trench T2 from forming a funnel-shaped profile so that the liner layer 330a on the sidewall surfaces SWA and SWB will not be excessively consumed. Therefore, an intact liner layer 330 can be formed in the first trench T1 and the second trench T2 according to the present embodiment.

Figure 20:
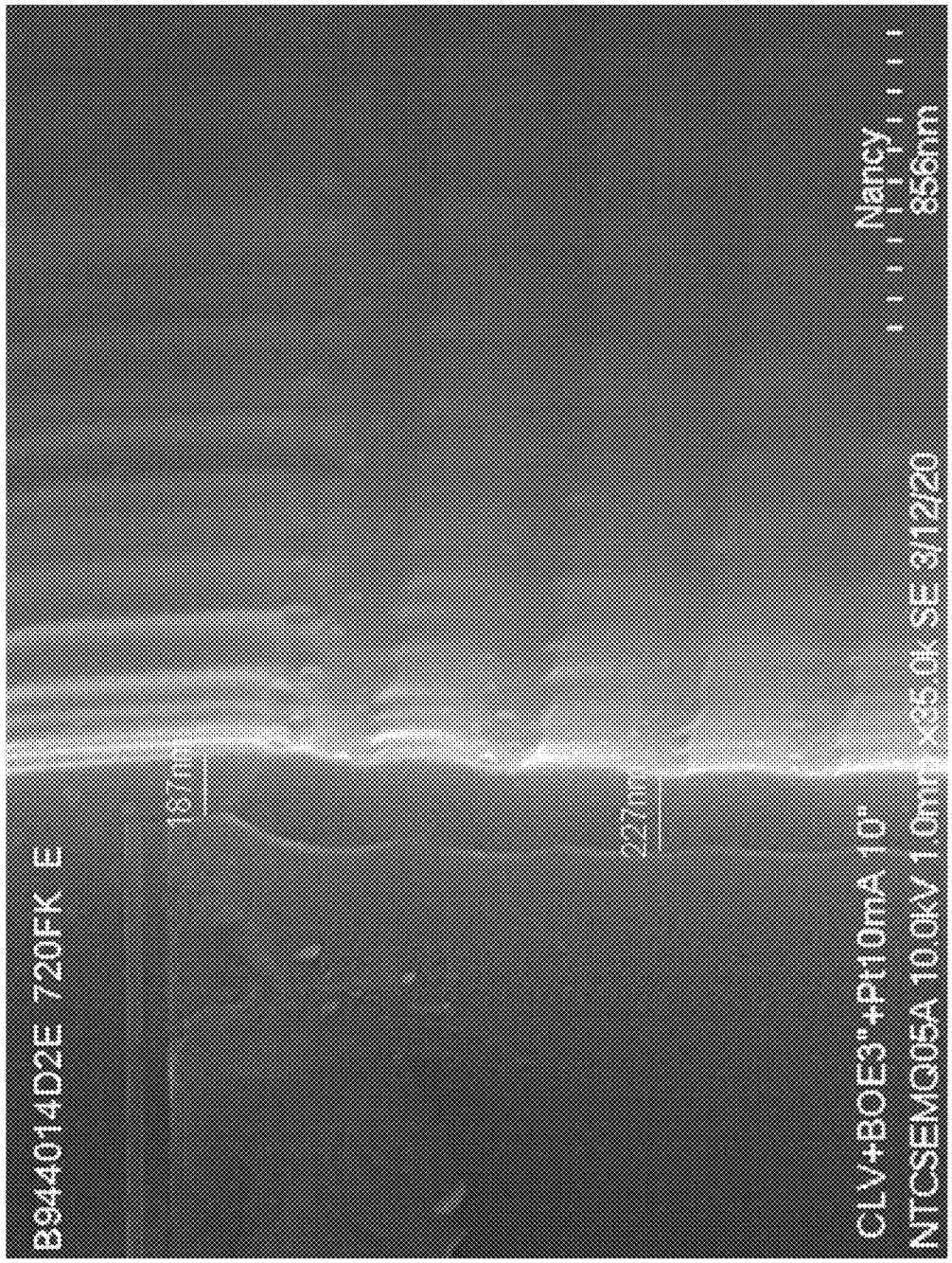
FIG. 20 is an SEM image showing the waist portion after a liner deposition process and a liner etching process are performed, in accordance with an embodiment of the present disclosure.

FIG. 20 is an SEM image showing the waist portion WT after the liner deposition process and the liner etching process are performed. In some embodiments, the thickness of the liner layer 330 may vary depending on a particular application. In an embodiment of the present disclosure, the thickness of the liner layer 330 is about 200 nm. As shown in FIG. 20, the liner layer 330 is intact and without any cracks or holes.

Figure 21:
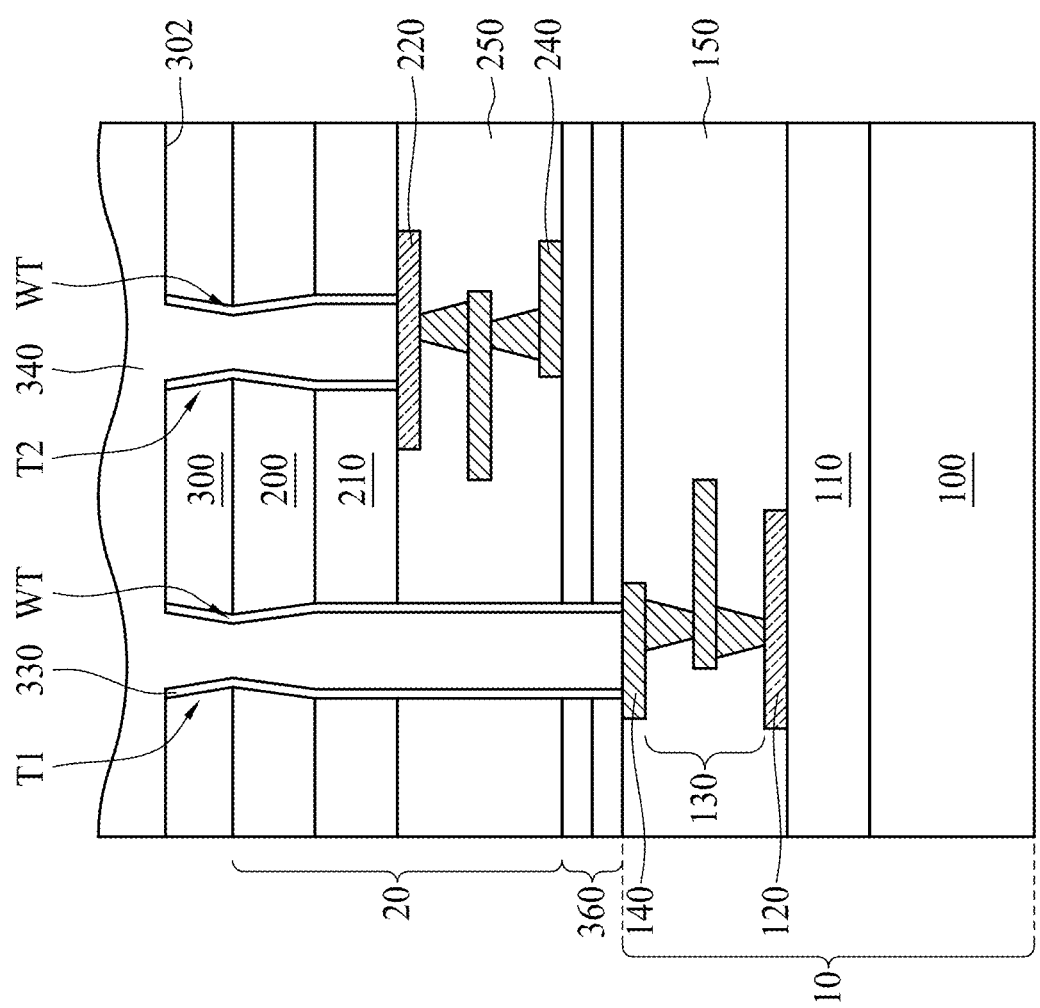
FIG. 21 to FIG. 24 are schematic cross-sectional views showing different steps according to the method in FIG. 6, in accordance with some embodiments of the present disclosure.

With reference to FIG. 21, a first conductive material deposition is performed on the second device 20 according to step S114 in FIG. 6. In some embodiments, before the first conductive material deposition is performed, a diffusion barrier layer (not shown) may be conformally formed in the first trench T1 and in the second trench T2 coated with the liner layer 330 prior to the first conductive material deposition. The diffusion barrier layer, which lines the first trench T1 and the second trench T2, functions as an isolation to prevent metal diffusion and as an adhesion layer between metal and dielectric materials. The material of the diffusion barrier layer includes TaN, Ta, Ti, TiN, TiSiN, WN, or combinations thereof. After the diffusion barrier layer is formed, a seed layer (not shown) is formed on the diffusion barrier layer. In some embodiments, the seed layer is a copper seed layer that may be formed by physical vapor deposition (PVD). In some embodiments, after the seed layer is formed, a first conductive material 340 is deposited to fill the first and second trenches T1 and T2. In some embodiments, the first conductive material deposition is an electro-plating process. In some embodiments, the first conductive layer 340 may include a low resistivity conductor material selected from the group of conductor materials including, but not limited to, copper and copper-based alloy. Alternatively, the first conductive layer 340 may comprise various materials, such as tungsten, aluminum, gold, silver, and the like. In an embodiment, the first conductive layer 340 is a copper-containing material formed over the copper seed layer.

Figure 22:
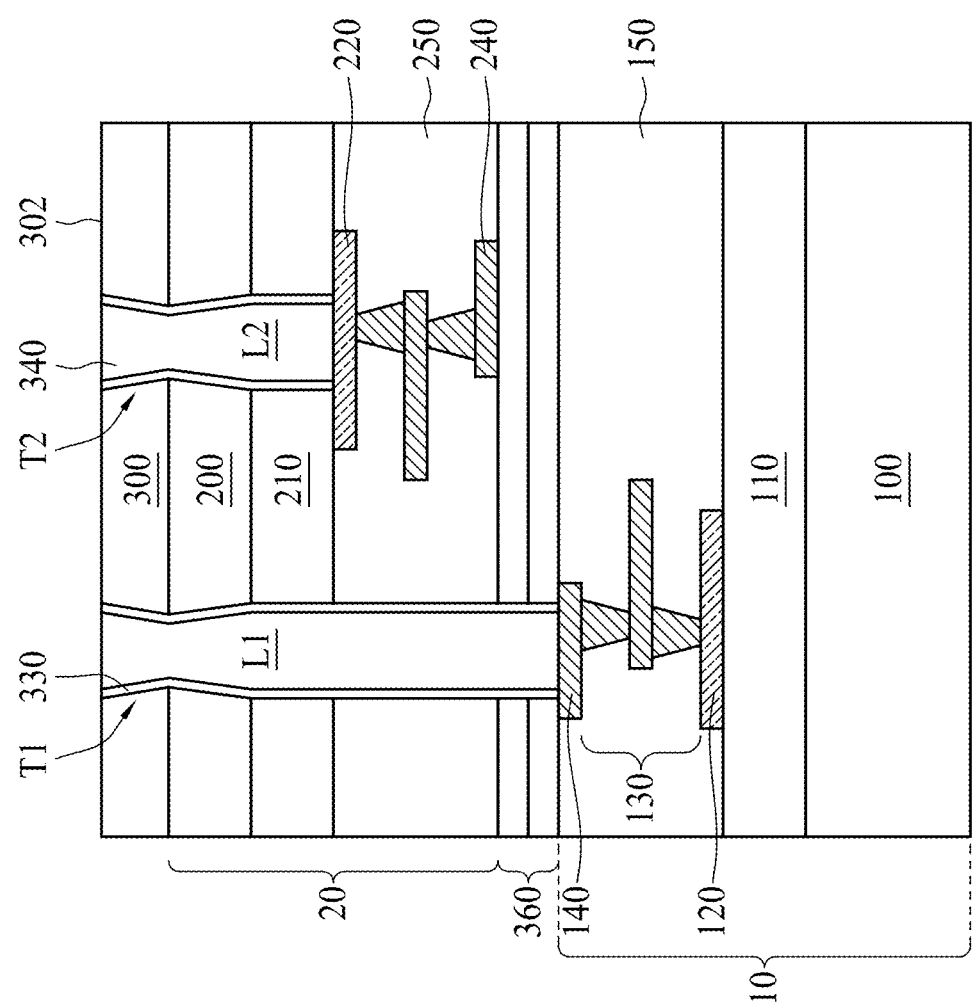

With reference to FIG. 22, a polishing process is performed to remove a portion of the conductive material 340 according to step S115 in FIG. 6. Specifically, the conductive material 340 above the passivation layer 300 is polished. In some embodiments, the polishing process may be a chemical mechanical polishing (CMP), which planarizes the conductive material 340 overflowing the first and second trenches T1 and T2. At such time, a first leg L1 and a second leg L2, which are respectively located in the first trench T1 and the second trench T2, are formed. The first leg L1 and the second leg L2 comprise the conductive material 340 and are used for electrical connection. In some embodiments, the first leg L1 is electrically connected to the first TML 140 of the first device 10. In some embodiments, the second leg L2 is electrically connected to the second BML 220 of the second device 20. In some embodiments, the first leg L1 is longer than the second leg L2. In some embodiments, the first leg L1 is substantially parallel to the second leg L2.

Figure 23:
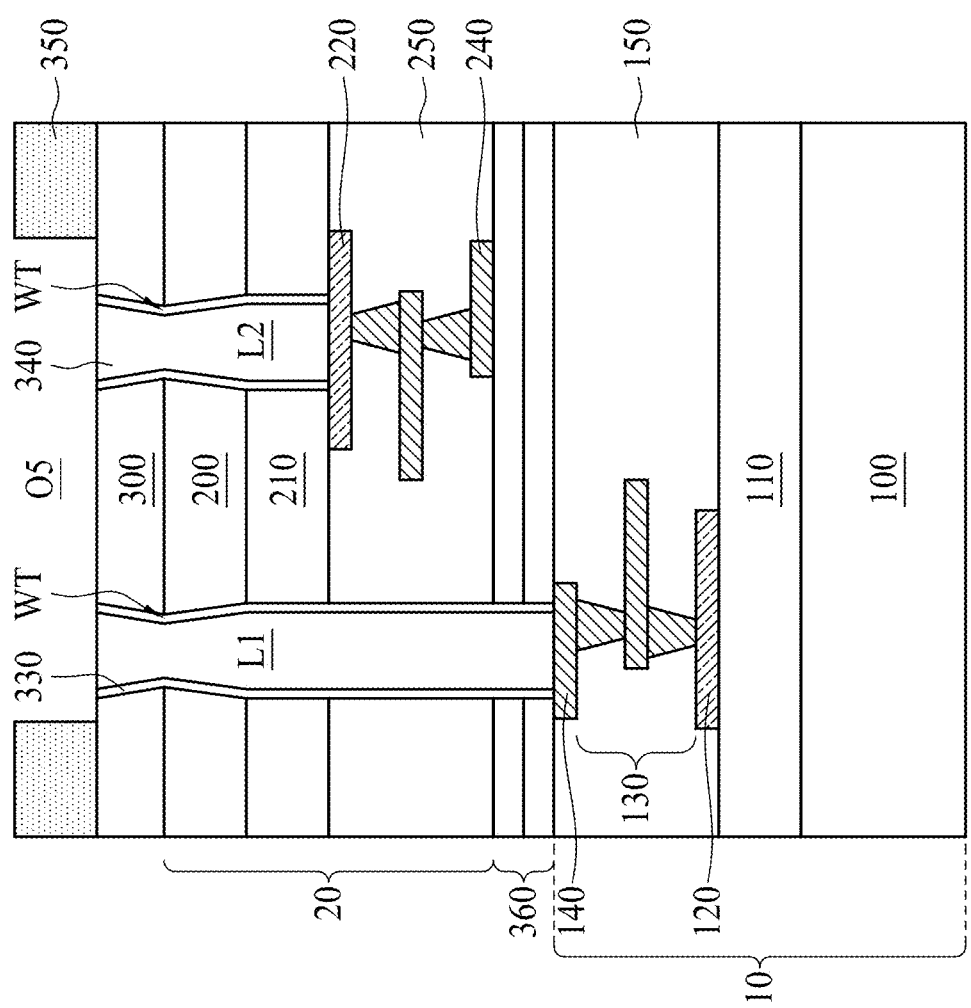

With reference to FIG. 23, a protection layer 350 is formed on the second device 20 according to step S116 in FIG. 6. In some embodiments, the material of the protection layer 350 may include silicon oxide ($SiO_2$), silicon nitride (SiN), silicon oxynitride (SiON) or the like. Specifically, the protection layer 350 covers a portion of the passivation layer 300 on the second device without covering the first leg L1 and the second leg L2. In some embodiments, the protection layer 350 surrounds a contact hole O5 over the first leg L1, the second leg L2 and a portion of the passivation layer 300.

Figure 24:
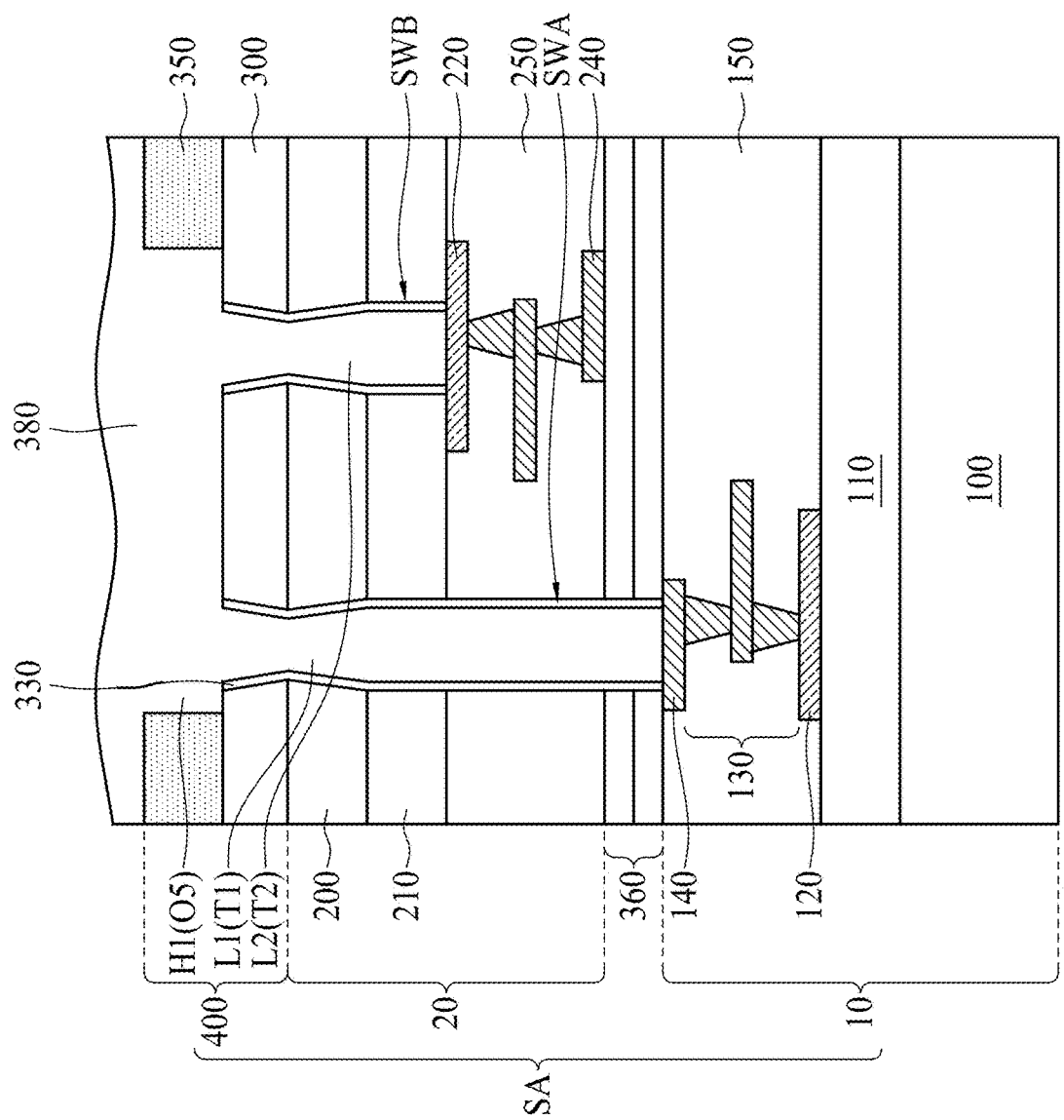

With reference to FIG. 24, a second conductive material deposition is performed on the second device 20 according to step S117 in FIG. 6. In some embodiments, the second conductive material deposition is an electro-plating process. A second conductive material 380 is electro-plated to fill the contact hole O5, followed by a planarization process. The second conductive material 380 deposited in the contact hole O5 forms a head member H1 surrounded by the protection layer 350. Specifically, the head member H1 is formed on the first leg L1, the second leg L2 and a portion of the passivation layer 300. In some embodiments, the second conductive material 380 and the first conductive material 340 include the same material. Therefore, the head member H1 may electrically connect the first leg L1 to the second leg L2. The first leg L1, the head member H1 and the second leg L2 collectively form an interconnect structure 400, which electrically connects the first TML 140 of the first device 10 to the second BML 220 of the second device 20. The first leg L1 and the second leg L2 are essentially conductive pillars, and the head member H1 is essentially a conductive bridge. At such time, a semiconductor assembly SA comprising the first device 10, the second device 20 and the interconnect structure 400 is generally formed. In some embodiments, the semiconductor assembly SA may be a memory stack, wherein the first device 10 and the second device 20 are memory devices. In an embodiment of the present disclosure, the semiconductor assembly SA has an intact liner layer 330, which can prevent the copper-containing material in the first leg L1 and the second leg L2 from diffusing into the silicon-containing second device 20. The robustly-formed liner layer 330 arises from the arrangement of the waist portions WT which prevent the first trench T1 and the second trench T2 from forming a funnel-shaped profile, which in turn prevents the liner layer 330 on the sidewall surfaces SWA and SWB from being consumed in the liner etching process.

Figure 25:
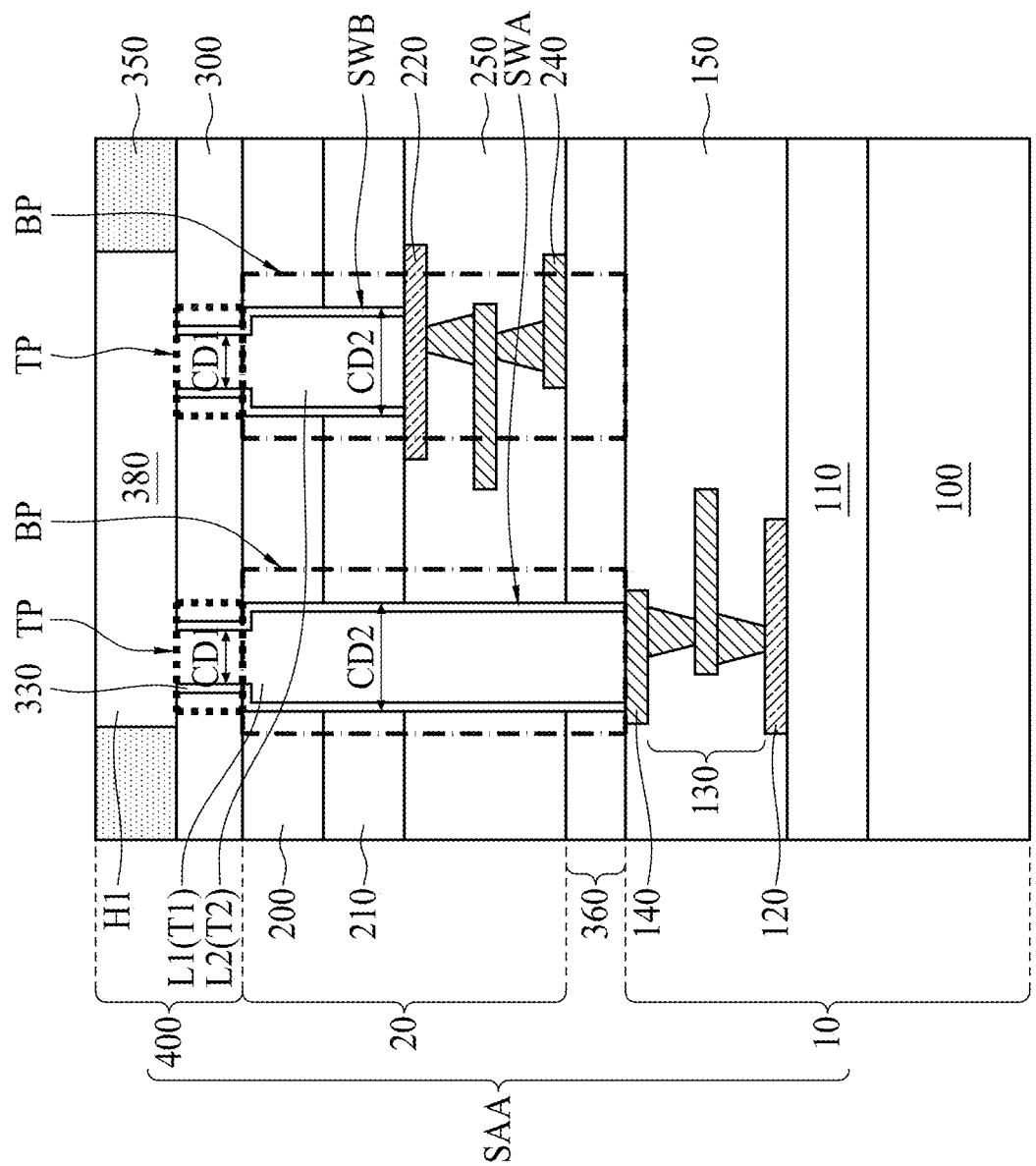
FIG. 25 is a schematic cross-sectional view of a semiconductor assembly SAA, in accordance with another embodiment of the present disclosure.

FIG. 25 is a schematic cross-sectional view of a semiconductor assembly SAA, in accordance with another embodiment of the present disclosure. The semiconductor assembly SAA is essentially fabricated according to the method 1000, with an only difference lying in the etching parameters in the first etching process, the second etching process and the third etching process (steps S109, S110 and S111, respectively). Elements and numerals of the semiconductor assembly SAA in FIG. 25 are identical to those of the semiconductor assembly SA in FIG. 24, and repeated description of the fabrication of the semiconductor assembly SAA is omitted for brevity. With reference to FIG. 25, in the structure of the semiconductor assembly SAA, the first trench T1 and the second trench T2 do not have a waist portion. However, an intact liner layer 330 can still be formed in the first trench T1 and the second trench T2. In some embodiments, each of the first trench T1 and the second trench T2 comprises a top portion TP connected to a bottom portion BP. The interface between the top portion TP and the bottom portion BP is at the same level as the interface between a passivation layer 300 (an oxide-containing material) and a second substrate 200 (a silicon-containing material). In some embodiments, the top portion TP has a nearly fixed first width W1, and the bottom portion BP has a nearly fixed second width W2. In some embodiments, the second width W2 is greater than the first width W1. The robustly-formed liner layer 330 arises from the arrangement of the top portion TP and the bottom portion BP, which prevent the first trench T1 and the second trench T2 from forming a funnel-shaped profile, which in turn prevents the liner layer 330 on sidewall surfaces SWA and SWB from being consumed in a liner etching process. As a result, a first leg L1 and a second leg L2 can be completely isolated from a second device 20. The copper-containing material in the first leg L1 and the second leg L2 will not diffuse through the liner layer 330 to the silicon-containing second device 20.

Figure 26:
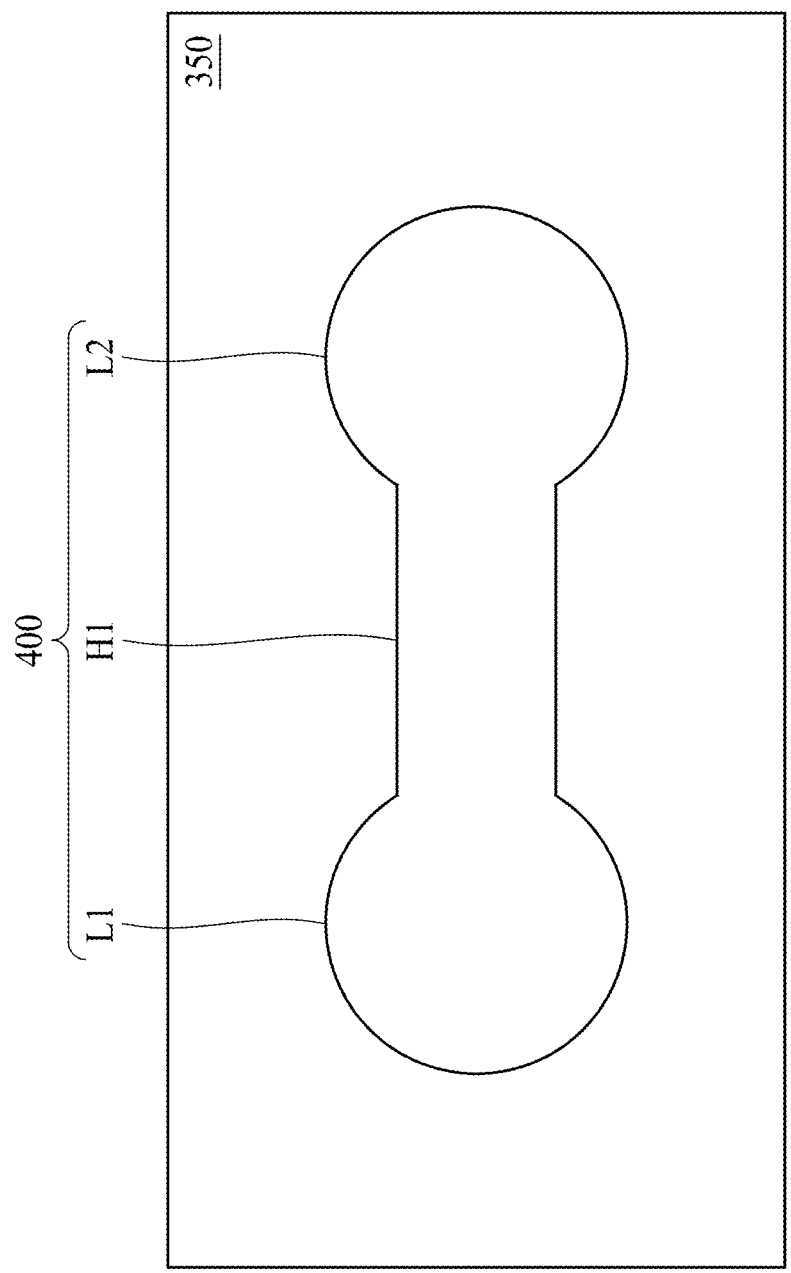
FIG. 26 is a top view of the semiconductor structure in FIG. 24, in accordance with some embodiments of the present disclosure.

FIG. 26 is a top view of the semiconductor structure in FIG. 24, in accordance with some embodiments of the present disclosure. Specifically, the interconnect structure 400 is surrounded by the protection layer 350. The interconnect structure 400 comprises the first leg L1, the head member H1 and the second leg L2. As shown in FIG. 26, in some embodiments, the first leg L1 and the second leg L2 are substantially circular in a top view. In other embodiments, the first leg L1 and the second leg L2 may be substantially rectangular or polygonal in a top view. The head member H1 contacts top ends of the first leg L1 and the second leg L2. As a result, the interconnect structure 400 electrically connects the first device 10 to the second device 20.

In the present disclosure, semiconductor assemblies and a method for fabricating the semiconductor assemblies are disclosed. The method prevents a trench from forming a funnel-shaped profile. Therefore, a liner layer on a sidewall surface within the trench will not be excessively consumed in a liner etching process. The intact liner layer may not have cracks and may not have missing portions. As a result, a copper-containing material in a first leg and in a second leg will not diffuse to a silicon-containing second device. In addition, current leakage or shorting problems can be prevented with an isolation function provided by the intact liner layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:
1. A semiconductor assembly, comprising:
a first device comprising a first top metal layer;
a second device, bonded to the first device and comprising a second bottom metal layer;
a passivation layer, disposed on the second device; and
an interconnect structure electrically coupling the first device to the second device, wherein the interconnect structure comprises:
a head member disposed on the passivation layer;
a first leg penetrating through the passivation layer and the second device, the first leg connecting the head member to the first top metal layer; and
a second leg penetrating through the passivation layer and extending into the second device to connect the head member to the second bottom metal layer, and wherein the first leg and the second leg each comprise:
a top portion, disposed in the passivation layer and having a first critical dimension; and
a bottom portion, connected to the top portion and having a second critical dimension, wherein the second critical dimension is greater than the first critical dimension.

2. The semiconductor assembly according to claim 1, wherein the first device and the second device are memory devices.

3. The semiconductor assembly according to claim 1, wherein the first leg electrically connects the first top metal layer of the first device to the head member and the second leg electrically connects the second bottom metal layer of the second device to the head member.

4. The semiconductor assembly according to claim 1, further comprising a bonding layer interposed between the first device and the second device.

5. The semiconductor assembly according to claim 1, wherein the first device and the second device are arranged in a front-to-front configuration.

6. The semiconductor assembly according to claim 1, wherein the head member is surrounded by a protection layer.

7. The semiconductor assembly according to claim 1, wherein the head member is above the first leg and the second leg.

8. The semiconductor assembly according to claim 1, further comprising a liner layer, wherein the first leg and the second leg are surrounded by the liner layer.

9. A semiconductor assembly, comprising:
a first device comprising a first top metal layer;
a second device, bonded to the first device and comprising a second bottom metal layer;
a passivation layer disposed on the second device; and
an interconnect structure electrically coupling the first device to the second device, wherein the interconnect structure comprises:
a head member disposed on the passivation layer;
a first leg penetrating through the passivation layer and the second device, the first leg connecting the head member to the first top metal layer; and
a second leg penetrating through the passivation layer and extending into the second device to connect the head member to the second bottom metal layer, and wherein the first leg and the second leg each comprise:
a top portion penetrating through the passivation layer and having a first critical dimension that gradually decreases at positions of increasing distance from the head member;
an intermediate portion extending from the top portion and penetrating through a second substrate of the second device, wherein the intermediate portion has a second critical dimension that gradually increases at positions of increasing distance from the head member; and
a bottom portion extending from the intermediate portion.

10. The semiconductor assembly according to claim 9, wherein the bottom portion has a substantially uniform critical dimension.

11. The semiconductor assembly according to claim 9, wherein the top portion and the intermediate portion have identical maximum critical dimension.

12. The semiconductor assembly according to claim 9, further comprising a liner layer, wherein the first leg and the second leg are surrounded by the liner layer.

13. The semiconductor assembly according to claim 9, wherein the head member is surrounded by a protection layer.

14. The semiconductor assembly according to claim 9, further comprising a bonding layer interposed between the first device and the second device.

15. A method for fabricating a semiconductor assembly, comprising:
   providing a first device and a second device, wherein the first device comprises a first top metal layer and the second device comprises a second bottom metal layer disposed on a second substrate;
   bonding the second device to the first device via a bonding layer;
   forming a passivation layer on the second device;
   forming a first trench penetrating through the passivation layer, the second device and the bonding layer to expose the first top metal layer;
   forming a second trench penetrating through the passivation layer and a portion of the second device to expose the second bottom metal layer;
   forming a liner layer within the first trench and the second trench; and
   depositing a first conductive material to fill the first trench and the second trench, wherein said forming the first trench exposes a surface of the second substrate and said forming the second trench exposes another surface of the second substrate, and
   wherein surfaces of the passivation layer exposed by the first trench and the second trench are discontinuous with the surfaces of the second substrate.

16. The method according to claim 15, wherein the forming of the first trench and the second trench comprises:
   forming a plurality of first openings penetrating through the passivation layer;
   forming a plurality of second openings penetrating through the second substrate, wherein the second openings are connected to the first openings;
   forming a third opening connected to one of the second openings to expose the first top metal layer; and
   forming a fourth opening connected to another one of the second openings to expose the second bottom metal layer.

17. The method according to claim 16, wherein the first openings have a first width that gradually decreases at positions of decreasing distance from the first device.

18. The method according to claim 16, wherein the second openings have a second width that gradually increases at positions of decreasing distance from the first device.

19. The method according to claim 15, further comprising: performing a polishing process to remove the first conductive material above a top surface of the passivation layer.

20. The method according to claim 19, further comprising:
   forming a protection layer on the passivation layer;
   forming a contact hole that exposes a portion of the passivation layer and the first conductive material in the first trench and in the second trench; and
   depositing a second conductive material in the contact hole.

* * * * *